(12) United States Patent
Guo et al.

(10) Patent No.: US 12,266,506 B2
(45) Date of Patent: Apr. 1, 2025

(54) SCANNING IMPEDANCE MEASUREMENT IN A RADIO FREQUENCY PLASMA PROCESSING CHAMBER

(71) Applicant: Applied Materials, Inc., Santa Clara, CA (US)

(72) Inventors: Yue Guo, Redwood City, CA (US); Kartik Ramaswamy, San Jose, CA (US); Nicolas J. Bright, Arlington, WA (US); Yang Yang, Singapore (SG); A N M Wasekul Azad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 454 days.

(21) Appl. No.: 17/930,139

(22) Filed: Sep. 7, 2022

(65) Prior Publication Data

US 2024/0079212 A1 Mar. 7, 2024

(51) Int. Cl.
*H01J 37/32* (2006.01)
*G01R 27/02* (2006.01)
*H01L 21/66* (2006.01)

(52) U.S. Cl.
CPC ........ *H01J 37/32183* (2013.01); *G01R 27/02* (2013.01); *H01L 22/20* (2013.01); *H01J 2237/3341* (2013.01)

(58) Field of Classification Search
CPC ........ H01J 37/32183; H01J 2237/3341; G01R 27/02; H01L 22/20
See application file for complete search history.

(56) References Cited

U.S. PATENT DOCUMENTS

2009/0000942 A1\* 1/2009 Bai .................. H01J 37/32082
204/298.03
2020/0126762 A1\* 4/2020 Yang ................ H01J 37/32183
(Continued)

FOREIGN PATENT DOCUMENTS

KR 1020080113962 A 12/2008

OTHER PUBLICATIONS

International Search Report/ Written Opinion issued to PCT/US2022/051912 on May 25, 2023.

*Primary Examiner* — Alexander H Taningco
*Assistant Examiner* — Pedro C Fernandez
(74) *Attorney, Agent, or Firm* — Patterson + Sheridan, LLP

(57) ABSTRACT

Embodiments of the disclosure include a method of processing a substrate in a plasma processing system, comprising delivering an RF signal, by an RF generator, through an RF match to an electrode assembly disposed within the plasma processing system, wherein while delivering the RF signal the RF match is set to a first matching point, and delivering a voltage waveform, by a waveform generator, to the electrode assembly disposed within the plasma processing system while the RF signal is delivered to the electrode assembly. The method includes receiving, by the RF match, a synchronization signal from a RF generator or the waveform generator, measuring, by an output sensor of the RF match, a first set of impedance related data of the plasma processing system over a first time period, the first time period beginning after a first delay triggered by a first portion of a first waveform pulse of the synchronization signal, measuring, by the output sensor of the RF match, a second set of impedance related data of the plasma processing system over a second time period, the second time period beginning after a second delay triggered by the first portion of the first waveform pulse of the synchronization signal, (Continued)

calculating, by the RF match, a combined impedance parameter based on the measured first set of impedance related data and the measured second set of impedance related data, and adjusting a matching parameter within the RF match based on the calculated combined impedance parameter to achieve a second matching point.

20 Claims, 14 Drawing Sheets

(56) References Cited

U.S. PATENT DOCUMENTS

| | | |
|---|---|---|
| 2020/0203129 A1* | 6/2020 | Koshimizu ........ H01J 37/32183 |
| 2020/0203219 A1 | 6/2020 | Nguyen et al. |
| 2020/0218774 A1* | 7/2020 | Howald ................ G06F 30/367 |
| 2020/0359489 A1* | 11/2020 | Kim .................. H01J 37/32183 |

* cited by examiner

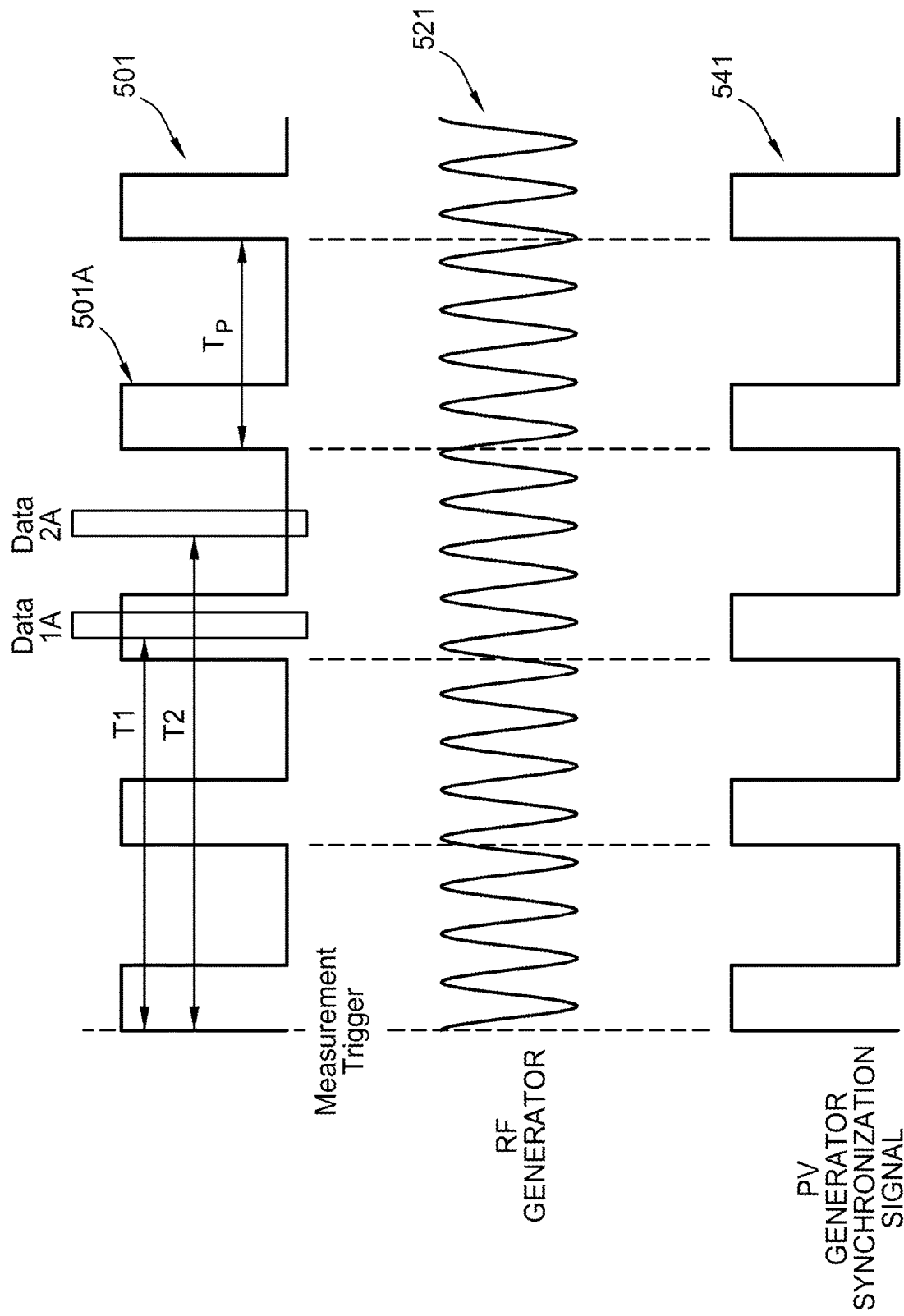

SCANNING IMPEDANCE MEASUREMENT IN A RADIO FREQUENCY PLASMA PROCESSING CHAMBER

BACKGROUND

Field

Embodiments of the present invention generally relate to a system and methods used in semiconductor device manufacturing. More specifically, embodiments provided herein generally include a system and methods for processing a substrate in a plasma processing system.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

A typical Reactive Ion Etch (RIE) plasma processing chamber includes a radio frequency (RF) bias generator, which supplies an RF voltage to a power electrode. In a capacitively coupled gas discharge, the plasma is created by using a radio frequency (RF) generator that is coupled to the power electrode that is disposed within an electrostatic chuck (ESC) assembly or within another portion of the processing chamber. Typically, an RF matching network ("RF match") tunes an RF waveform provided from an RF generator to deliver RF power to an apparent load of 500 to minimize the reflected power and maximize the power delivery efficiency. If the impedance of the load is not properly matched to impedance of the source (e.g., the RF generator), a portion of the forward delivered RF waveform can reflect back in the opposite direction along the same transmission line.

A number of plasma processes also utilize DC voltage pulsing schemes to control the plasma sheath disposed over the substrate that is being processed. During operation, the DC voltage pulses cause a generated plasma sheath to toggle between states that includes a thick plasma sheath and state where no plasma sheath exists. Typical, DC pulsing techniques are configure to deliver voltage pulses at a frequency greater than 100 kHz, such as greater than 400 kHz. The toggling of the plasma sheath due to the delivery DC pulsed voltage waveform results in the plasma load having varying impedance values over time. It has been found that due to the interaction between the RF waveform and DC pulsed voltage waveform that are simultaneously provided during plasma processing can lead differing plasma processing results due in large part to the RF matching portion of the RF power delivery system's inability to adjust the RF matching point to account for the rapidly changing plasma load impedance values over time. Conventional impedance matching components and matching processes are unable to keep up with the rapid changes in magnitude of the plasma load impedance, thus causing the match to find undesirable matching points that typically leads to the generation of varying amounts of RF power that are actually delivered to the plasma load due to: 1) inter-modulation distortion (IMD) of the RF signal; and 2) undesirably high reflected RF powers found at harmonics of the driven RF frequency. The inter-modulation distortion created by the interaction between the RF and DC pulsed voltage waveforms causes the amplitude of at least the RF signal to vary over time. The interaction or intermodulation between the RF and DC pulsed voltage waveforms causes additional undesirable waveform components to form at frequencies that are not just at harmonic frequencies (i.e., integer multiples) of the interacting signals, such as either of the RF or DC pulsed waveforms. The generation of the IMD components in a power delivery system will reduce the actual forward RF power that is delivered to the plasma load. Due at least to unavoidable differences in processing chamber power delivery configurations and differences in the power delivery components, the rapidly changing plasma load impedance values cause undesirable differences in the plasma processing results seen in a single plasma processing chamber, seen in similarly configured processing chambers on a single processing system, and also seen in similarly configured plasma processing chambers within different plasma processing systems within a semiconductor fabrication site. Moreover, the generated IMD components are also not easily accounted for in most power delivery systems due to the broad range of frequencies that can develop during plasma processing in the same or different processing chambers and thus will cause unexpected variations in the power actually delivered to the plasma load during plasma processing.

Thus, there is a need in the art for plasma processing devices and biasing methods that are at least able to resolve this issues outlined above.

SUMMARY

Embodiments of the disclosure include a method of processing a substrate in a plasma processing system, comprising delivering an RF signal, by an RF generator, through an RF match to an electrode assembly disposed within the plasma processing system, wherein while delivering the RF signal the RF match is set to a first matching point, and delivering a voltage waveform, by a waveform generator, to the electrode assembly disposed within the plasma processing system while the RF signal is delivered to the electrode assembly. The method further includes receiving, by the RF match, a synchronization signal from a RF generator or the waveform generator, measuring, by an output sensor of the RF match, a first set of impedance related data of the plasma processing system over a first time period, the first time period beginning after a first delay triggered by a first portion of a first waveform pulse of the synchronization signal, measuring, by the output sensor of the RF match, a second set of impedance related data of the plasma processing system over a second time period, the second time period beginning after a second delay triggered by the first portion of the first waveform pulse of the synchronization signal, calculating, by the RF match, a combined impedance parameter based on the measured first set of impedance related data and the measured second set of impedance related data, and adjusting a matching parameter within the RF match based on the calculated combined impedance parameter to achieve a second matching point.

Embodiments of the present application may further provide a method of processing a substrate in a plasma processing system comprising generating a plasma in a processing volume of the plasma processing system, wherein generating the plasma by delivering an RF waveform that comprises sequentially delivering a first RF pulse and a second RF pulse, the first RF pulse comprises a first RF power level and the second RF pulse comprises a second RF power level, and the sequentially delivered first and second RF pulses are formed by delivering an RF signal through an RF match and to an electrode assembly of the plasma processing system. The method further includes detecting a transition region between the first RF pulse and the second RF pulse, determining a scanning impedance of the plasma processing system during the transition region between the first RF pulse and the second RF pulse, determining a baseline impedance of the plasma processing system during the first RF pulse or the second RF pulse, and calculating a combined impedance parameter based on the scanning impedance and the baseline impedance.

Embodiments of the present application may further provide a plasma processing system comprising an RF generator configured to deliver an RF signal through an RF match to an electrode assembly disposed within the plasma processing system, wherein while delivering the RF signal the RF match is set to a first matching point, a voltage waveform generator configured to deliver a voltage waveform to the electrode assembly disposed within the plasma processing system while the RF signal is delivered to the electrode assembly. The RF match comprises an input sensor, an output sensor, an RF match controller, and a memory for storing a program to be executed in the RF match controller, the program comprising instructions when executed cause the RF match controller to receive, by the RF match, a synchronization signal from a RF generator or the waveform generator, measure, using the output sensor, a first set of impedance related data of the plasma processing system over a first time period, the first time period beginning after a first delay triggered by a first portion of a first waveform pulse of the synchronization signal, measure, using the output sensor of the RF match, a second set of impedance related data of the plasma processing system over a second time period, the second time period beginning after a second delay triggered by the first portion of the first waveform pulse of the synchronization signal, calculate, by the RF match controller, a combined impedance parameter based on the measured first set of impedance related data and the measured second set of impedance related data, and adjust a matching parameter within the RF match based on the calculated combined impedance parameter to achieve a second matching point.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 5A-5D each illustrate voltage pulses provided within a voltage waveform that are delivered to a bias electrode and a synchronization signal delivered to an RF match during plasma processing, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a system used in a semiconductor device manufacturing process. More specifically, embodiments provided herein generally include apparatus and methods for synchronizing and controlling the delivery of an RF bias voltage to one or more electrodes disposed within a plasma processing chamber to better control the efficient delivery of RF power to a plasma formed in the processing region of a plasma processing chamber.

Figure 1:
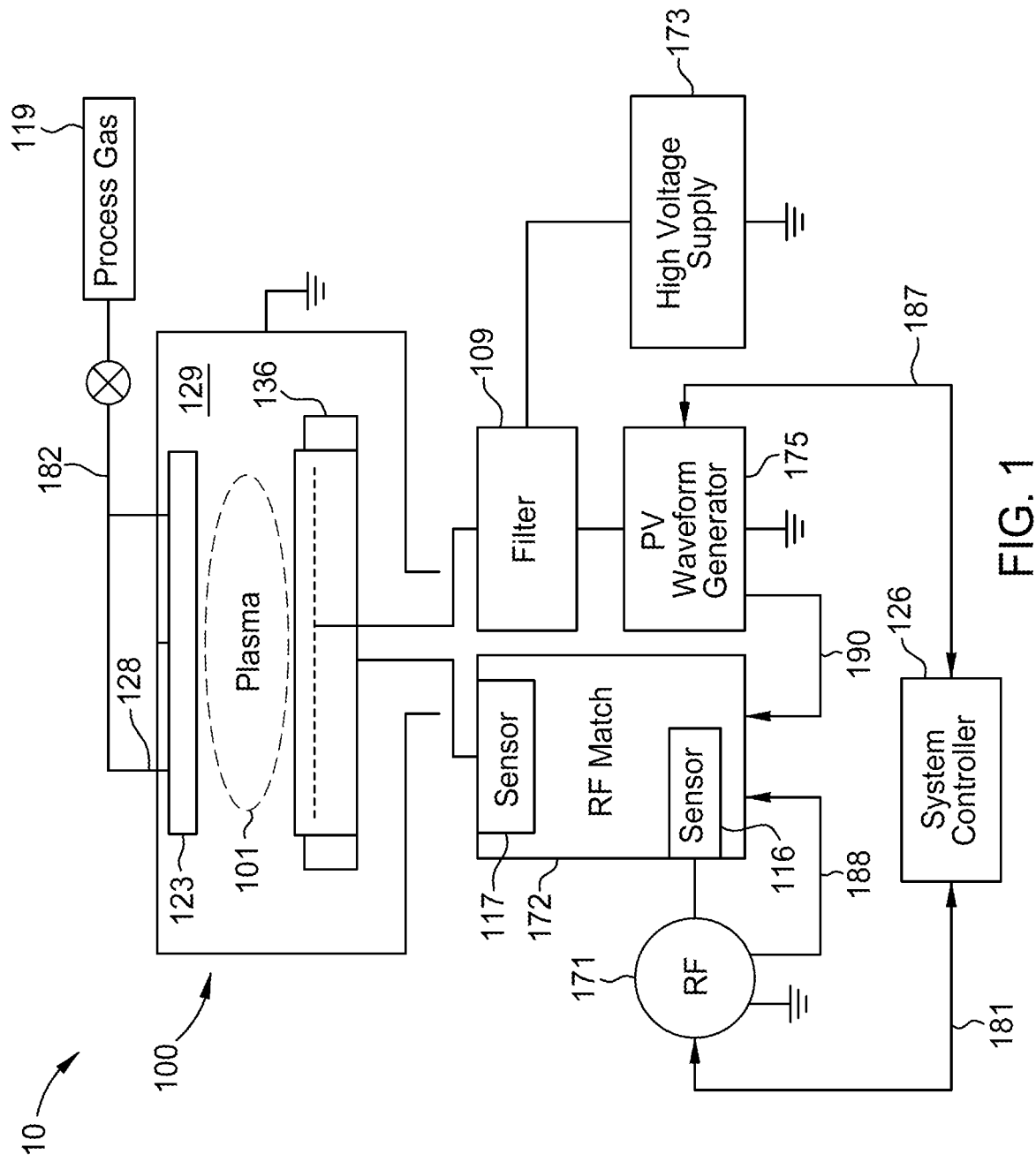
FIG. 1 is a simplified schematic representation of a plasma processing system, according to one or more embodiments.

FIG. 1 is a schematic representation of a processing system, according to one or more embodiments, that is configured to practice one or more of the methods set forth herein. In some embodiments, the plasma processing system 10 is configured for plasma-assisted etching processes, such as a reactive ion etch (RIE) plasma processing. The plasma processing system 10 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing. In one configuration, as shown in FIG. 1, the plasma processing system 10 is configured to form a capacitively coupled plasma (CPP). However, in some embodiments, a plasma may alternately be generated by an inductively coupled source disposed over the processing region of the plasma processing chamber system 10.

The plasma processing system 10 includes a processing chamber 100, a chamber lid 123, a system controller 126, a substrate support assembly 136, a gas delivery system 182, a high voltage supply 173, a pulsed voltage (PV) waveform generator 175, a radio frequency (RF) generator 171, and an RF match 172. In some embodiments, the RF generator 171 and the PV waveform generator 175 are both coupled to the substrate support assembly 136. The RF generator 171 is configured to deliver an RF signal to ignite and maintain a plasma 101 in a processing volume 129 of the processing chamber 100. The PV waveform generator 175 is configured to deliver a pulse voltage (PV) waveform to bias the substrate support assembly 136.

The system controller 126 is communicatively coupled to both the RF generator 171 and the PV waveform generator 175. The system controller 126 is used to control the process sequence used to process a substrate. The system controller 126 is coupled to the RF generator 171 using a first communication line 181 and the PV waveform generator 175 using a second communication line 187. The system controller 126 is configured to send command signals to the RF generator 171 and the PV waveform generator 175 via their respective communication lines 181, 187. The communication lines 181, 187 are also used to transfer data and synchronize the delivery of RF signals and PV waveform signals from the RF generator 171 and the PV waveform generator 175, respectively, to a desired electrode within the processing chamber.

The RF generator 171 is coupled to an electrode within the substrate support assembly 136 via an RF match 172 disposed between the RF match 172 and the substrate support assembly 136. The RF match 172 includes an input sensor 116 and an output sensor 117. The input sensor is configured to measure impedance related parameters and other characteristics, such as the voltage, current, harmonics, phase, power, and combinations thereof of the RF generator 171 (i.e. the source). The output sensor 117 is configured to measure impedance related data such as the voltage, current, harmonics, phase, power, impedance and combinations thereof of the plasma processing system 10 (e.g. the plasma 101 generated in the processing volume 129, known as the load). If the load and source impedances are not properly matched, a portion of the RF waveform can be reflected back in the opposite direction. Therefore, the RF match 172 is configured to adjust one or more of its electrical components within the RF match 172 based on the impedances measured by the input sensor 116 and the output sensor 117 during processing. This will be described in more detail below.

However, as further described below, in plasma processing configurations where PV waveforms and RF signals are simultaneously being provided to one or more electrodes disposed within the processing region 129 to form a plasma 101 therein, the impedance of the complex load created by the plasma 101 will fluctuate at least in part due to a varying RF power level and/or varying voltage applied in each of the voltage pulses provided in the PV waveform provided from the PV waveform generator 175. In some other plasma processing configurations where pulsed RF signals are provided to the processing region 129 of plasma processing chamber 100 to form a plasma 101 therein, the impedance of the complex load created by the plasma 101 will fluctuate at least in part due to the varying RF power level. The varying impedance of the complex load requires the RF matching elements, which are used to ensure the efficient delivery of RF power to the complex load, to make impedance tuning adjustments in response to the varying impedance in an effort to ensure that the maximum forward RF power is provided to the complex load while the amount of reflected power is minimized at any time. However, most RF conventional RF matches include mechanical tuning elements that are unable to keep up with the rate that the impedance that the complex load is varying, which leads to large fluctuations in the match point, the amount of reflected RF power and inefficiency and/or damage to the power delivery system.

In some embodiments, the PV waveform generator 175 is coupled to an electrode disposed in the substrate support assembly 136 via a filter 109 disposed between the PV waveform generator 175 and the substrate support assembly 136. The filter 109 is configured to isolate the PV waveform generator 175 from the RF signal and other signals created within the processing chamber 100 during plasma processing.

In an effort to control and synchronize the delivery of an RF signal from the RF generator 171 to an electrode within the processing chamber 100 through the RF match 172, the RF generator 171 is also separately coupled to the RF match 172 using a third communication line 188. The third communication line 188 is configured to enable the bi-directional communication between the RF match 172 and the RF generator 171 to control and efficiently deliver the RF signal to the complex load. In an effort to control and synchronize the delivery of an PV waveform from the PV waveform generator 175 to an electrode within the processing chamber 100, the PV waveform generator 175 is also coupled to the RF match 172 using a fourth communication line 190. The fourth communication line 190 is also configured to enable the bi-directional communication between the RF match 172 and the PV waveform generator 175 to help control and synchronize the delivery of PV waveform and the RF signal to the complex load. In some embodiments, the RF generator 171 is configured to transmit a synchronization signal to the RF match 172 via the third communication line 188. In some embodiments, the PV waveform generator 175 is configured to transmit a synchronization signal to the RF match 172 via the fourth communication line 190. In some embodiments, the synchronization signal transmitted from the RF generator 171 or the synchronization signal transmitted from the PV waveform generator 175 is used to trigger the output sensor 117 to impedance related data of the plasma processing system 10. This will be described in more detail below. In some embodiments, the synchronization signals transmitted from the RF generator 171 and the PV waveform generator 175 are also received by and transmitted from the RF match 172 to the PV waveform generator 175 and RF generator 171, respectively, to allow the synchronization of the RF match 172, PV waveform generator 175 and RF generator 171.

In some embodiments, a high voltage supply 173 is also coupled to an electrode disposed within the substrate support assembly 136. The high voltage supply 173 is configured to supply a chucking voltage to the substrate support assembly 136. The high voltage supply 173 is coupled to the substrate support assembly 136 via the filter 109. The filter is disposed between the high voltage supply 173 and the substrate support assembly 136.

A gas delivery system 182 is coupled to the processing volume 129 of the processing chamber 100. The gas delivery system 182 is configured to deliver at least one processing gas from at least one gas processing source 119 to the processing volume 129 via one or more gas inlets 128 positioned through the chamber lid 123.

Figure 2:
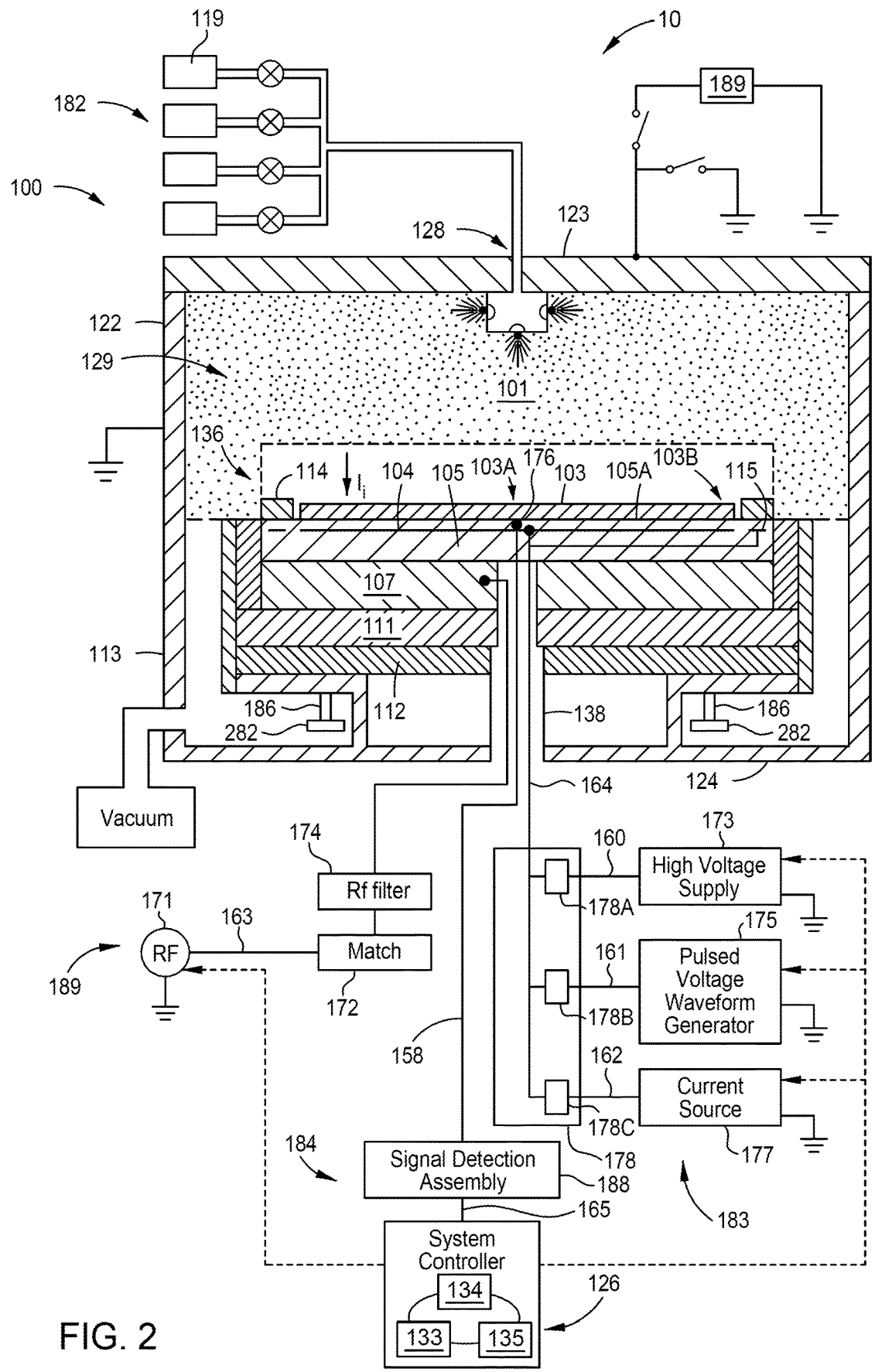
FIG. 2 is a schematic cross-sectional view of a plasma processing system that can be configured to perform one or more of the plasma processing methods described herein, according to one or more embodiments.

FIG. 2 is a more detailed schematic cross-sectional view of a configuration of the plasma processing system 10 illustrated in FIG. 1, which is configured to perform one or more of the plasma processing methods set forth herein. In one configuration, as shown in FIG. 2, the plasma processing system 10 is configured to form a capacitively coupled plasma (CPP). However, in some embodiments, a plasma 101 may alternately be generated by use of an inductively coupled source disposed over the processing region 129 of the plasma processing system 10. In this configuration, a coil may be placed on top of a ceramic lid (vacuum boundary) of the processing chamber 100.

The plasma processing system 10 includes the processing chamber 100, the substrate support assembly 136, the gas delivery system 182, a power system 183, an RF power system 189, and a system controller 126. As shown in FIG. 2, the processing chamber 100 includes a chamber body 113 that comprises a chamber lid 123, one or more sidewalls 122, and a chamber base 124. The chamber lid 123, one or more sidewalls 122, and the chamber base 124 collectively define the processing volume 129. The one or more sidewalls 122 and chamber base 124 generally include materials (such as aluminum, aluminum alloys, or stainless steel alloys) that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. A substrate 103 is loaded into, and removed from, the processing volume 129 through an opening (not shown) in one of the sidewalls 122. The opening is sealed with a slit valve (not shown) during plasma processing of the substrate 103. A gas delivery system 182, which is coupled to the processing volume 129 of the processing chamber 100, includes a processing gas source 119 and a gas inlet 128 disposed through the chamber lid 123. The gas inlet 128 is configured to deliver one or more processing gases to the processing volume 129 from the plurality of processing gas sources 119.

As explained above, the processing chamber 100 further includes an upper electrode (e.g., chamber lid 123) and the substrate support assembly 136 that are disposed in a processing volume 129. As shown in FIG. 2, in one embodiment, a radio frequency (RF) source is electrically coupled to a lower electrode (e.g., substrate support base 107) disposed within the substrate support assembly 136. The RF generator 171 is configured to deliver an RF signal to ignite and maintain the plasma 101 between the upper and lower electrodes. In some alternative configurations, the RF generator 171 can also be electrically coupled to an upper electrode, such as the chamber lid 123.

As shown in FIG. 2, the substrate support assembly 136 includes a substrate support 105, a substrate support base 107, an insulator plate 111, a ground plate 112, a plurality of lift pins 186, one or more substrate potential sensing assemblies 184, and a bias electrode 104. Each of the lift pins 186 are disposed through a through hole formed in the substrate support assembly 136 and are used to facilitate the transfer of a substrate 103 to and from a substrate receiving surface 105A of the substrate support 105. The substrate support 105, which can include an electrostatic chuck, is formed of a dielectric material. The dielectric material can include a bulk sintered ceramic material, a corrosion-resistant metal oxide (for example, aluminum oxide ($Al_2O_3$), titanium oxide (TiO), yttrium oxide ($Y_2O_3$), a metal nitride material (for example, aluminum nitride (AlN), titanium nitride (TiN)), mixtures thereof, or combinations thereof.

The substrate support base 107 is formed of a conductive material (for example aluminum, an aluminum alloy, or a stainless steel alloy). The substrate support base 107 is electrically isolated from the chamber base 124 by the insulator plate 111, and the ground plate 112 interposed between the insulator plate 111 and the chamber base 124. In some embodiments, the substrate support base 107 is configured to regulate the temperature of both the substrate support 105, and the substrate 103 disposed on the substrate support 105 during substrate processing. In some embodiments, the substrate support base 107 includes one or more cooling channels (not shown) disposed therein that are fluidly coupled to, and in fluid communication with, a coolant source (not shown), such as a refrigerant source or substrate source having a relatively high electrical resistance. In other embodiments, the substrate support 105 includes a heater (not shown) to heat the substrate support 105 and substrate 103 disposed on the substrate support 105.

A bias electrode 104 is embedded in the dielectric material of the substrate support 105. Typically, the bias electrode 104 is formed of one or more electrically conductive parts. The electrically conductive parts typically include meshes, foils, plates, or combinations thereof. In some embodiments, the bias electrode 104 can function as a chucking pole (i.e., electrostatic chucking electrode) that is used to secure (e.g., electrostatically chuck) the substrate 103 to the substrate receiving surface 105A of the substrate support 105. In general, a parallel plate like structure is formed by the bias electrode 104 and a layer of the dielectric material that is disposed between the bias electrode 104 and the substrate receiving surface 105A. The dielectric material can typically have an effective capacitance $C_E$ of between about 5 nF and about 50 nF. Typically, the layer of dielectric material (e.g., aluminum nitride (AlN), aluminum oxide ($Al_2O_3$), etc.) has a thickness between about 0.03 mm and about 5 mm, such as between about 0.1 mm and about 3 mm, such as between about 0.1 mm and about 1 mm, or even between about 0.1 mm and 0.5 mm. The bias electrode 104 is electrically coupled to a clamping network, which provides a chucking voltage thereto. The clamping network includes the high voltage DC supply 173 that is coupled to a filter 178A of the filter assembly 178 that is disposed between the high voltage supply 173 and bias electrode 104. In one example, the filter 178A is a low-pass filter that is configured to block RF frequency and pulsed voltage (PV) waveform signals provided by other biasing components found within the processing chamber 100 from reaching the high voltage supply 173 during plasma processing. In one configuration, the static DC voltage is between about −5000V and about 5000V, and is delivered using an electrical conductor (such as a coaxial power delivery line 106). In some embodiments, the bias electrode 104 can also bias the substrate 103 with the respect to the plasma 101 using one or more of the pulsed-voltage biasing schemes described in further detail below by use of the PV waveform generator 175.

In some configurations, the substrate support assembly 136, further includes an edge control electrode 115. The edge control electrode 115 is formed of one or more electrically conductive parts. The electrically conductive parts typically include meshes, foils, plates, or combinations thereof. The edge control electrode 115 is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. As seen in FIG. 2, the edge control electrode 115 is positioned within a region of the substrate support 105, and is biased by use of an output provided from the pulsed voltage (PV) waveform generator 175. In one configuration, the edge control electrode 115 is biased by use of a PV waveform generator that is different from the PV waveform generator 175 used to bias electrode 104. In another configuration, the edge control electrode 115 is biased by splitting part of the signal provided from the PV waveform generator 175 to the bias electrode 104.

As shown in FIG. 2, the power system 183 includes the high voltage supply 173, the PV waveform generator 175, and a current source 177. The RF power system 189 includes a radio frequency (RF) generator 171, RF match 172, and a RF filter 174. In one example, as shown in FIG. 2, a power delivery line 163 electrically connects the output of the RF generator 171 to an RF match 172, an RF filter 174 and substrate support base 107. As previously mentioned, during plasma processing, the high voltage supply 173 provides a constant chucking voltage, while the RF generator 171 delivers an RF signal to the processing region, and the PV waveform generator 175 establishes a PV waveform at the bias electrode 104. Applying a sufficient amount of RF power to an RF bias voltage signal, which is also referred to herein as a RF waveform, is provided to an electrode (e.g., substrate support base 107) so as to cause the plasma 101 to be formed in the processing volume 129 of the processing chamber 100. In one configuration, the RF waveform has a frequency range between about 1 MHz and about 200 MHz, such as between 2 MHz and 40 MHz.

In some embodiments, the power system 183 further includes a filter assembly 178 to electrically isolate one or more of the components contained within the power system 183. Power delivery line 160 electrically connects the output of the high voltage DC supply 173 to a filter assembly 178. Power delivery line 161 electrically connects the output of the PV waveform generator 175 to the filter assembly 178. Power delivery line 162 connects the output of the current source 177 to the filter assembly 178. In some embodiments, the current source 177 is selectively coupled to the bias electrode 104 by use of a switch (not shown) disposed in the power delivery line 162, so as to allow the current source 177 to deliver a desired current to the bias electrode 104 during one or more stages (e.g., ion current stage) of the voltage waveform generated by the PV waveform generator 175. As seen in FIG. 2, the filter assembly 178, includes multiple separate filtering components (i.e., discrete filters 178A-178C) that are each electrically coupled to the output node via power delivery line 164. In an alternative configuration, the filter assembly 178 includes one common filter electrically coupled to the output node via power delivery line 164. The power delivery lines 160-164 include electrical conductors that include a combination of coaxial cables, such as a flexible coaxial cable that is connected in series with a rigid coaxial cable, an insulated high-voltage corona-resistant hookup wire, a bare wire, a metal rod, an electrical connector, of any combination of the above.

The system controller 126, also referred to herein as a processing chamber controller, includes a central processing unit (CPU) 133, a memory 134, and support circuits 135. The system controller 126 is used to control the process sequence used to process the substrate 103. The CPU is a general-purpose computer processor configured for use in an industrial setting for controlling the processing chamber and sub-processors related thereto. The memory 134 described herein, which is generally non-volatile memory, can include random access memory, read-only memory, hard disk drive, or other suitable forms of digital storage, local or remote. The support circuits 135 are conventionally coupled to the CPU 133 and comprises cache, clock circuits, input/output subsystems, power supplied, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the plasma processing system 10.

Typically, the program, which is readable by the CPU 133 in the system controller 126 includes code, which, when executed by the CPU 133, performs tasks relating to the plasma processing schemes described herein. The program may include instructions that are used to control the various hardware and electrical components within the plasma processing system 10 to perform the various process tasks and various process sequences used to implement the methods described herein. In one embodiment, the program includes instructions that are used to perform one or more of the operations described below in relation to FIGS. 5-9.

Figure 3A:
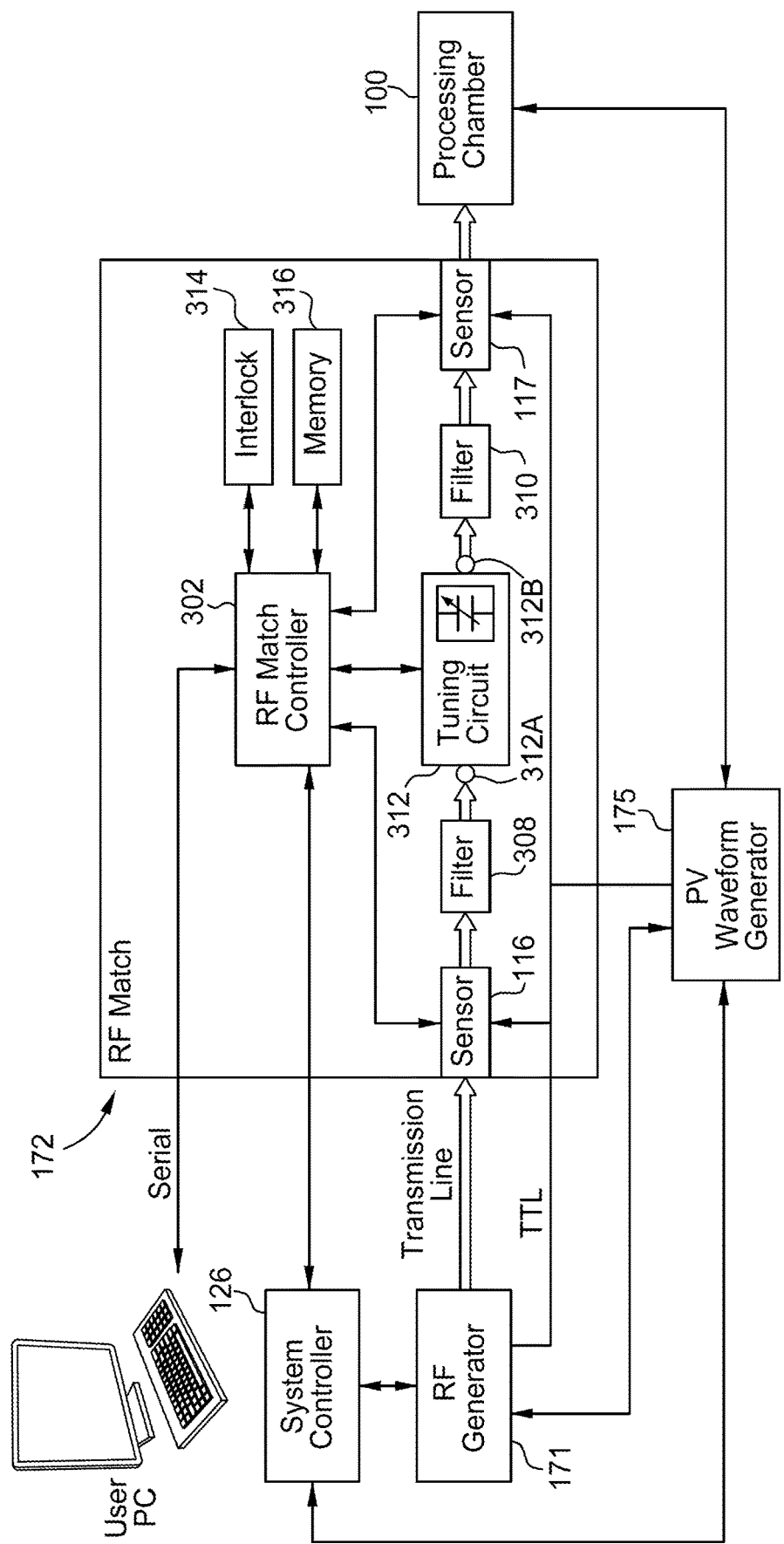
FIG. 3A is a schematic representation of a radio frequency (RF) power delivery system, according to one or more embodiments.

FIG. 3A is a schematic representation of a RF power delivery system, according to one or more embodiments. FIG. 3A includes a schematic representation of an RF match 172 and RF generator 171 that are configured to practice the methods set forth herein. The RF match 172 includes an RF match controller 302, the input sensor 116, an output sensor 117, a first RF filter 308, a second RF filter 310, a tuning circuit 312, an interlock 314, and a memory 316. The first RF filter 308 and the second RF filter 310 may be configured to block frequencies from other signals being transmitted to the processing chamber 100 to avoid interference. For example, the first RF filter 308 and the second RF filter may be low pass, high pass, or band pass filters.

Figure 3B:
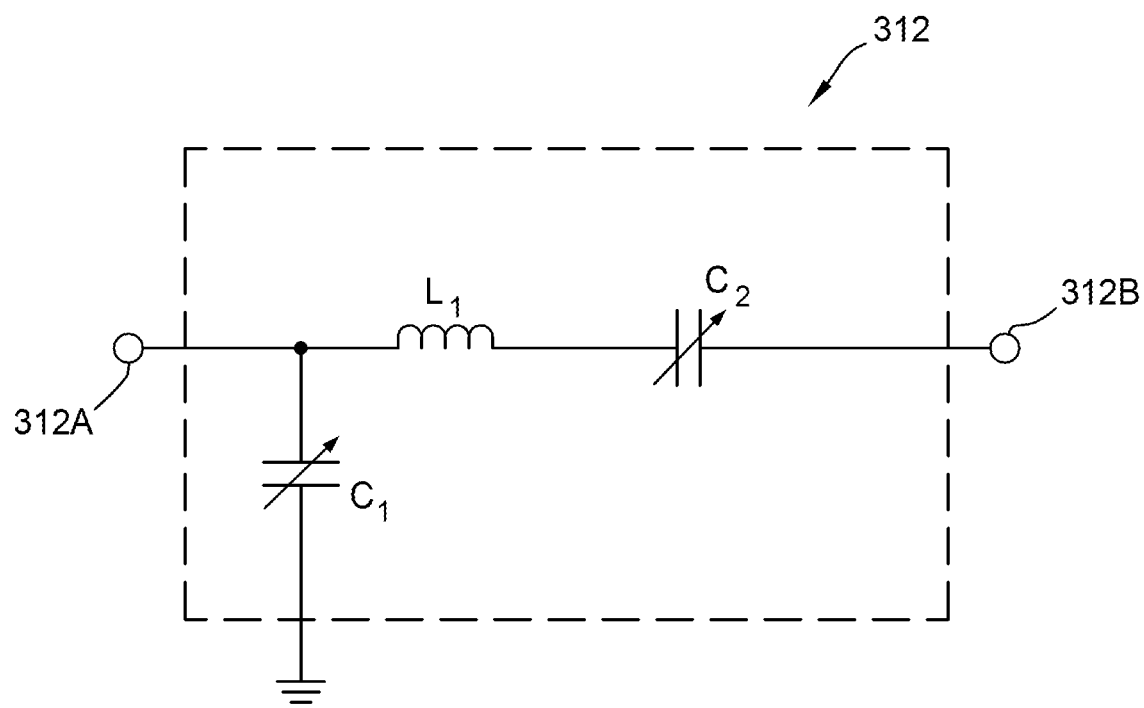
FIGS. 3B and 3C illustrate examples of tuning circuits that can be used within the radio frequency (RF) power delivery system, according to one or more embodiments.
Figure 3C:
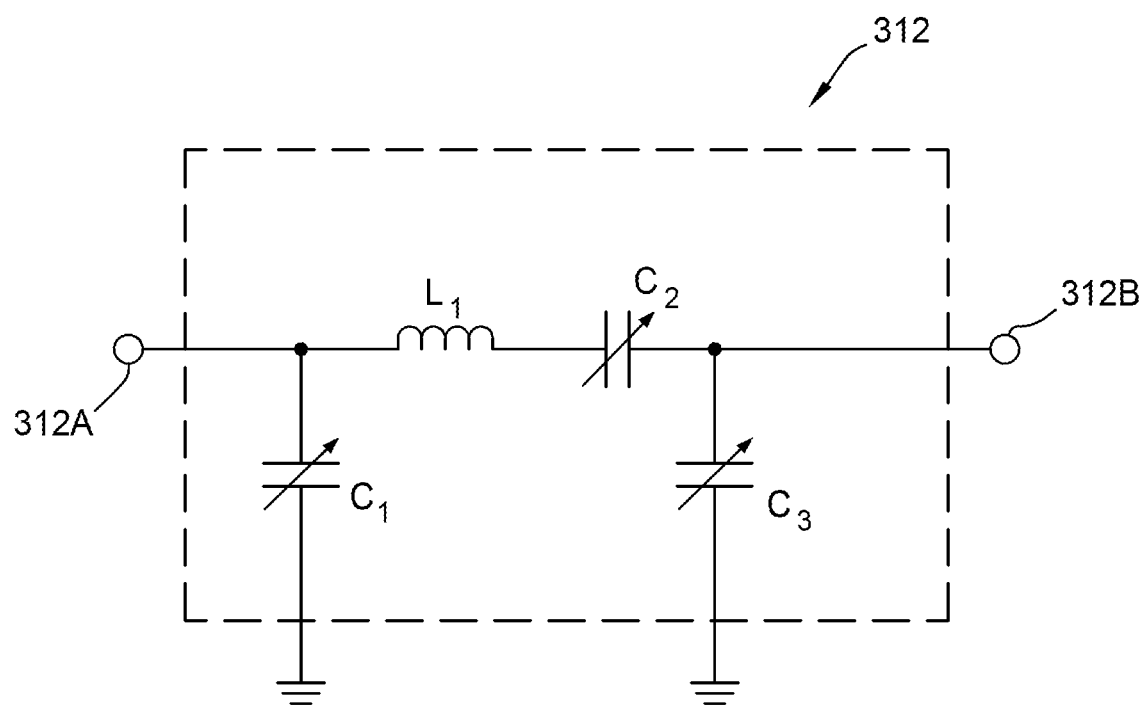

The RF match 172 is configured to receive an RF waveform from the RF generator 171, tune the RF waveform to minimize the reflected power and maximize power delivery efficiency, and deliver the tuned RF waveform to the processing chamber 100. In some embodiments, simultaneously, as described above, a PV waveform generator 175 is configured to provide a PV waveform to the processing chamber 100. The RF generator 171 and the PV waveform generator 175 are both coupled to and synchronized by the system controller 126. The RF match controller 302 may be communicationally coupled to the interlock 314, the memory 316, the tuning circuit 312, the input sensor 116, and the output sensor 117. In some embodiments, the RF match controller 302 is also in communication with an electronic device that includes a display and user interface, such as conventional computer (e.g., user PC), which may in some cases may form part of the system controller 126. The RF match controller 302 includes a central processing unit (CPU). The RF match controller 302 is configured to control the tuning circuit 312 to change an impedance parameter of the RF match 172. The tuning circuit 312 described herein may be a T-network tuning circuit, a pi-network tuning circuit, an L-network circuit, or the like. The tuning circuit 312 may include at least one electrical component, such as a variable capacitor and/or inductor that can be adjusted by the RF match controller 302 to change the impedance of the RF waveform delivered to the processing chamber 100. FIGS. 3B and 3C illustrate examples of an L-network tuning circuit and pi-network tuning circuit that include variable capacitors $C_1$ and $C_2$ and also $C_1$, $C_2$ and $C_3$, respectively, that can be used to adjust the impedance of the tuning circuit 312 relative to the complex load, and thus the matching point of the RF match 172. The tuning circuit 312 has an input 312A that is directly or indirectly coupled to the input sensor 116 and output 312B that is directly or indirectly coupled to the output sensor 117.

The memory 316 may be programmed for long term or short term memory storage. The memory 316 described herein, which is generally non-volatile memory, can include random access memory, read-only memory, hard disk drive, or other suitable forms of digital storage, local or remote. Software instructions (program) and data can be coded and stored within the memory 316 for instructing a processor within the RF match controller 302. A software program (or computer instructions) readable by the RF match controller 302 determines which tasks are performable by the components in the plasma processing system 10. Typically, the program, which is readable by the RF match controller 302 includes code, which, when executed, performs tasks relating to the plasma processing schemes described herein. The program may include instructions that are used to control the RF match 172 using the methods described herein. In one embodiment, the program includes instructions that are used to perform one or more of the operations described below in relation to FIGS. 5A-9.

The output sensor 117 may include a voltage sensor, and/or a current sensor configured to measure the impedances or the characteristics of the complex load formed within plasma processing system 10 during processing, as explained above. Stated otherwise the output sensor 117 is configured to measure impedance related data of the complex load such as the current, voltage, phase, harmonics, power and combinations thereof, and report them to the RF match controller 302. Then the RF match controller 302 may determine an impedance based on the impedance related data collected by the output sensor 117. The output sensor 117 can be disposed inside or outside the RF match 172 enclosure, and in some embodiments, may be disposed in other locations in the processing chamber 100.

The input sensor 116 may include a voltage sensor, and/or a current sensor configured to measure impedance related data based on the RF waveform provided from the RF generator 171, such as the current, phase, voltage, harmonics, power, and combinations thereof, and report them to the RF match controller 302. Then the RF match controller 302 may determine an impedance based on the impedance related data collected by the input sensor 116.

In embodiments, the input sensor 116 and the output sensor 117 are each configured to measure impedance related data based on a synchronization signal(s) received from the RF generator 171 and/or the PV waveform generator 175. There are multiple routes the synchronization signals can take to reach the sensors. For example an RF synchronization signal may be transmitted from the RF generator 171 to the input sensor 116, the output sensor 117, and the PV waveform generator 175. The RF generator 171 may send a synchronization signal to the PV waveform generator 175, and the PV waveform generator 175 may forward the synchronization signal to the input sensor 116 and the output sensor 117.

During processing the samples the first set of impedance related data during the data interval, which are discussed further below, can be triggered by a PVT synchronization signal, an RF synchronization, an external synchronization signal from signal generator, or internally with detected pulse edges. In one example, a PV synchronization signal may be transmitted from the PV waveform generator 175 to the input sensor 116, the output sensor 117, and the RF generator 171. In another example, a PV waveform generator 175 may send a synchronization signal to the RF generator 171, and the RF waveform generator 171 may forward the synchronization signal to the input sensor 116 and the output sensor 117.

Figure 4:
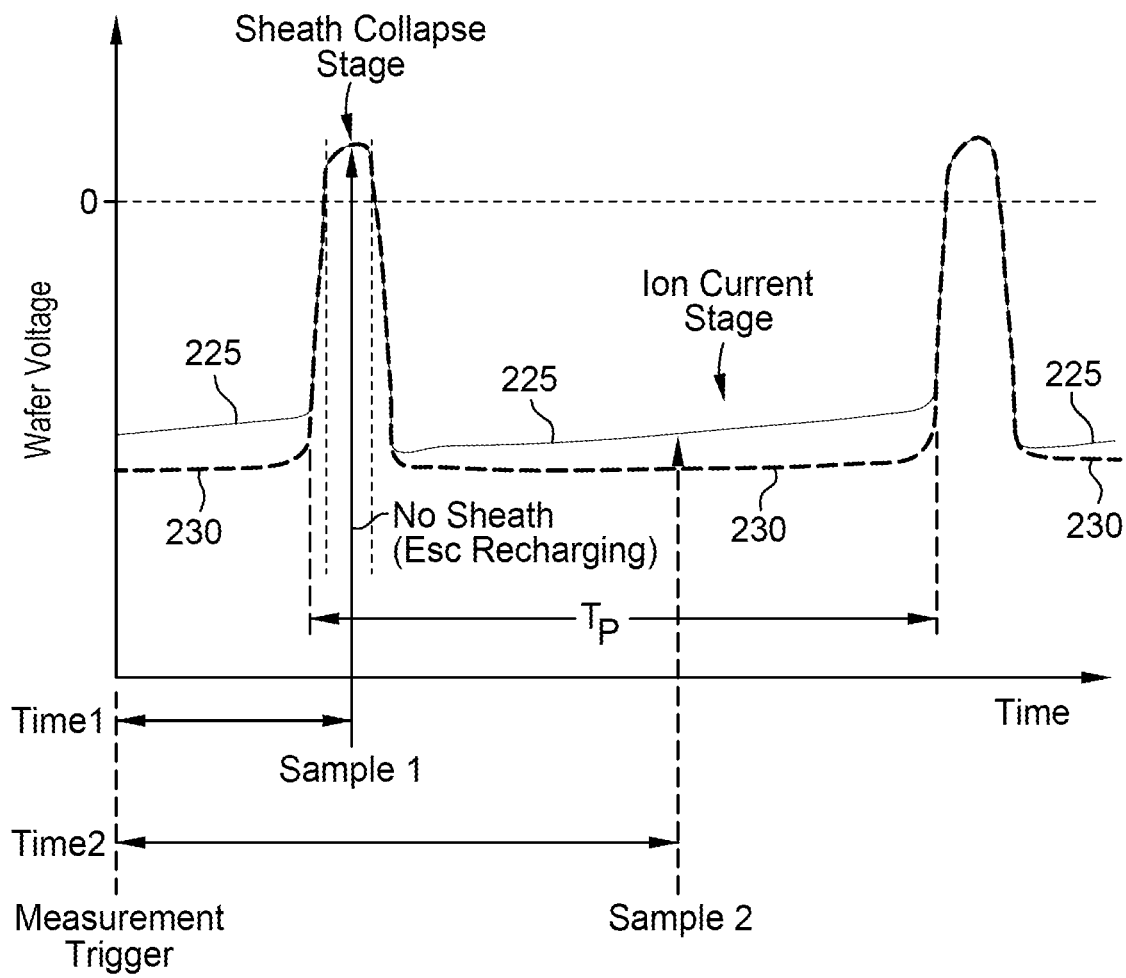
FIG. 4 illustrates voltage pulses provided within a voltage waveform that is established at a substrate due to the delivery of voltage pulses to a bias electrode during plasma processing, according to one or more embodiments.

FIG. 4 illustrates an example of voltage pulses provided within a voltage waveform that is established at a substrate due to the delivery of voltage pulses to a bias electrode during plasma processing by use of the PV waveform generator 175, according to one or more embodiments. It has been found that the establishment of the PV waveforms to a substrate during plasma processing can be advantageously used to control aspects of the plasma sheath formed over the surface of the substrate during plasma processing. The control of the magnitude and shape of plasma sheath formed over the surface of the substrate allows the control of the ion interaction with the surface of the substrate during processing, such as allowing the control the ion energy distribution function (IEDF), ion directionality, and other plasma related characteristics. FIG. 4 illustrates examples of two separate voltage waveforms that can be established at a substrate 103 disposed on the substrate receiving surface 105A of the substrate support assembly 136 of a processing chamber due to the delivery of pulsed voltage waveforms to the bias electrode 104 of the processing chamber. Waveform 225 is an example of a non-compensated pulsed voltage (PV) waveform established at the substrate 103 during plasma processing due to the delivery of a PV waveform provided to the bias electrode 104. Waveform 230 is an example of a compensated pulsed voltage (PV) waveform established at the substrate 103 by applying a negative slope waveform to the bias electrode 104 of the processing chamber during an "ion current stage" portion of the PV waveform cycle by use of the current source 177. The compensated pulsed voltage (PV) waveform can alternatively be established by applying a negative voltage ramp during the ion current stage of the pulsed voltage waveform generated by the PV waveform generator 175.

In FIG. 4, waveforms 225 and 230 include two main stages: an ion current stage and a sheath collapse stage. Both portions (the ion current stage and the sheath collapse stage) of the waveforms 225 and 230, can be alternately and/or separately established at the substrate 103 during plasma processing. At the beginning of the ion current stage, a drop in voltage at the substrate 103 is created, due to the delivery of a negative portion of a PV waveform (e.g., ion current portion) provided to the bias electrode 104 by the PV waveform generator 175, which creates a high voltage sheath above the substrate 103. The high voltage sheath allows the plasma generated positive ions to be accelerated towards the biased substrate during the ion current stage, and thus, for RIE processes, controls the amount and characteristics of the etching process that occurs on the surface of the substrate during plasma processing. In some embodiments, it is desirable for the ion current stage to generally include a region of a pulsed voltage waveform that achieves a voltage at the substrate that is stable or minimally varying throughout the stage. One will note that significant variations in voltage established at the substrate during the ion current stage, such as shown by the positive slope in the waveform 225, will undesirably cause a variation in the ion energy distribution function (IEDF) and thus cause undesirable characteristics of the etched features to be formed in the substrate during an RIE process.

Plasma sheath impedance varies with supplied PV waveform voltages applied in the PV waveform pulses provided from the PV waveform generator 175. As PV waveforms and RF signals are simultaneously provided to electrodes to form a plasma 101, the impedance of the load created by the plasma 101 will fluctuate in accordance to a varying voltage applied in each voltage pulse of the PV waveform as they interact with the RF signal provided by the RF generator 171. Similarly, the impedance of the load created by the plasma 101 may also fluctuate as the power level of the RF signal changes or pulsed RF signals are used to form the plasma 101. Conventionally, an RF match is unable to determine these changes in impedance and adjust the matching point in real-time.

Figure 5A:
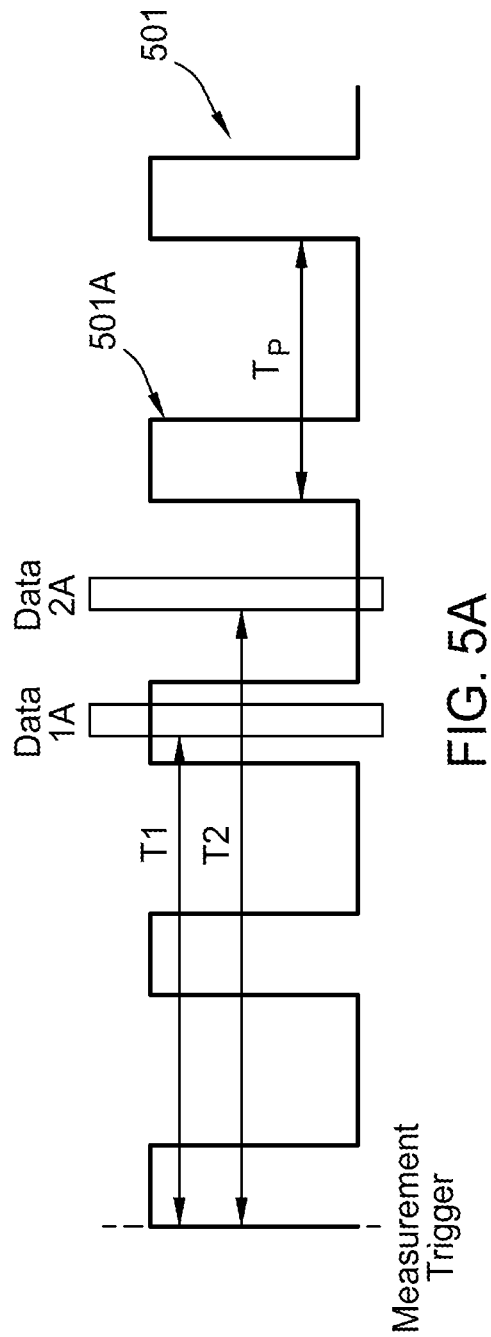
Figure 5C:
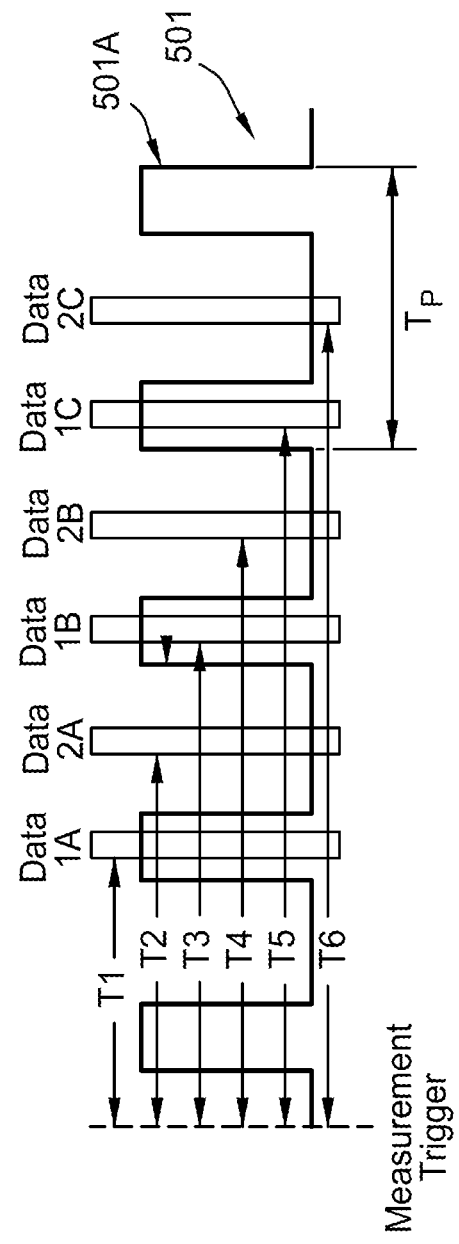

FIGS. 5A-5D and 8A-8C illustrate a method of using RF match 172 to sample the changes of impedance of the complex load generated by the plasma 101 and updating a matching point based on predetermined points within the varying voltages applied in each of the voltage pulses provided within the PV waveform. FIGS. 5A-5D each illustrate voltage pulses and synchronization signals (FIG. 5B) that are used in conjunction with the methods described in FIGS. 8A-8C to improve the control of the RF power delivered during plasma processing, according to one or more embodiments. FIGS. 5A-5D illustrate a process where the RF match 172 collects information useful for updating a matching point during a portion of one or more pulses within a PV waveform. The matching point may be updated based on the sampled impedances measured at a point within the plasma processing system 10 during a portion of one or more pulses within the PV waveform. FIG. 6 illustrates multiple synchronization signals provided to sensors of an RF match during plasma processing according to one or more embodiments.

Figure 8A:
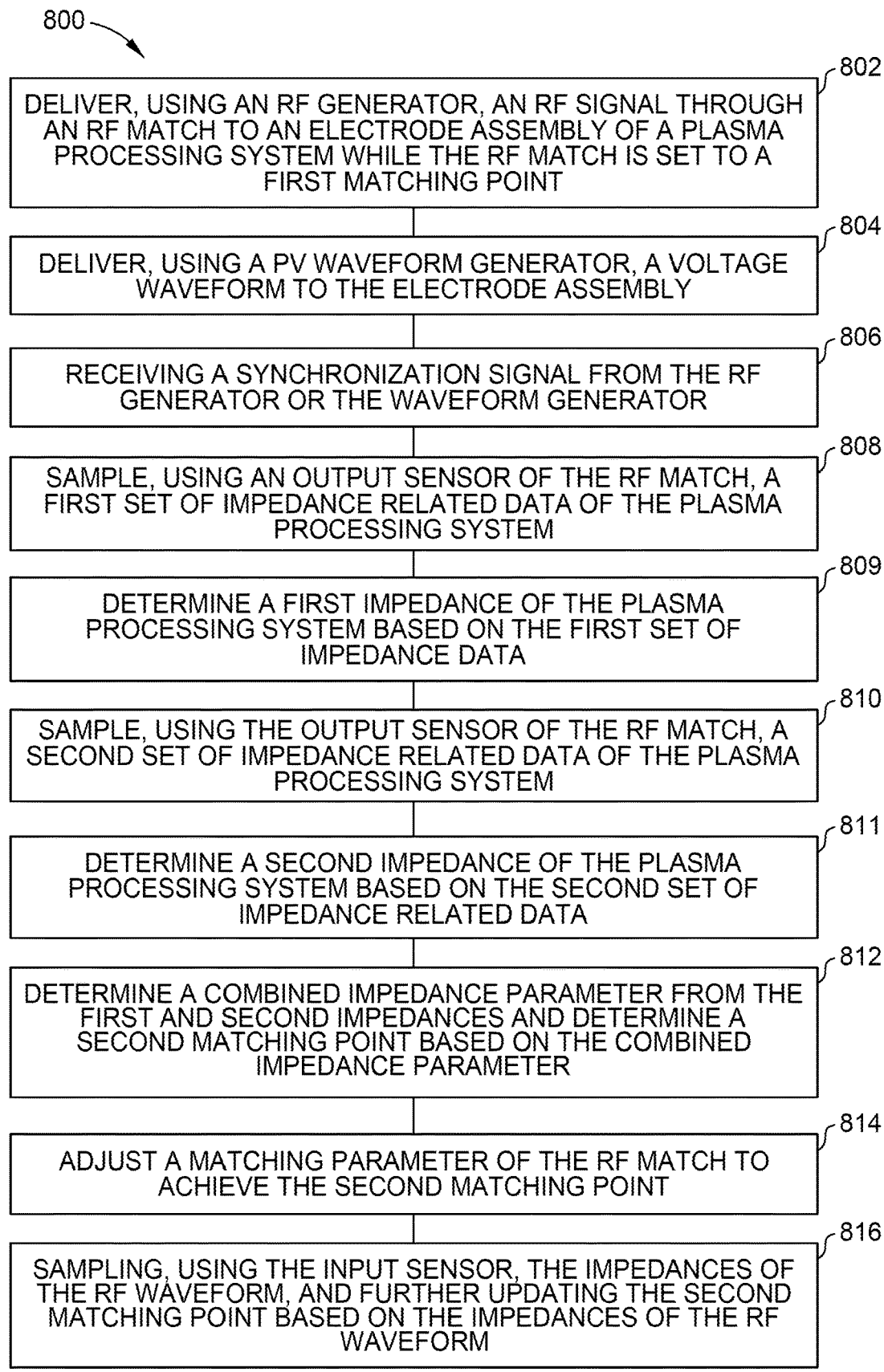
FIGS. 8A-8C illustrate methods of using an RF plasma processing system, according to certain embodiments.

FIG. 8A illustrates a method 800 of using an RF a plasma processing system (e.g., plasma processing system 10 FIGS. 1 and 2) according to certain embodiments. Method 800 is performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 800 is performed, in part, by a controller device (e.g., system controller 126 of FIGS. 1 and 2 and/or RF match controller 302 of FIG. 3A). In some embodiments, a non-transitory storage medium stores instructions (i.e., algorithm) that when executed by the controller device cause the controller device to perform method 800.

For simplicity of explanation, method 800 is depicted and described as a series of operations. However, operations in accordance with this disclosure can occur in various orders and/or concurrently and with other operations not presented and described herein. Furthermore, in some embodiments, not all illustrated operations are be performed to implement method 800 in accordance with the disclosed subject matter. In addition, those skilled in the art will understand and appreciate that method 800 could alternatively be represented as a series of interrelated states via a state diagram or events.

At block 802 of method 800, an RF generator 171 delivers an RF signal through an RF match 172 to an electrode assembly disposed within a plasma processing system 10 to form the plasma 101 in the processing volume 129. The RF signal is delivered to the electrode assembly at a first matching point set by the RF match 172. As explained above, the first matching point is used by the RF match to change its impedance so that the impedance between the source (e.g., the RF signal) and the impedance of the plasma processing system 10 (e.g. the impedance of the load created by the plasma 101) are substantially equal, but will likely not be close enough to a desired matching point due to initially varying load impedance values. In some embodiments, the settings of the various components within the RF match 172, such as a variable capacitor in the tuning circuit 312, that are used to achieve the first matching point is based on a prior calibration process or knowledge of the similar systems, and is preset and stored in memory for use as a starting point by the controller 302 within the RF match 172.

At block 804 of method 800, a PV waveform generator 175 delivers a voltage waveform 501 that includes a plurality of pulses 501A that each have a pulse period $T_p$ to an electrode disposed within the plasma processing system 10, as shown in FIGS. 1-2 and 5A-5B, and 5D. The plurality of pulses 501A are simultaneously provided with the RF waveform 521 (FIGS. 5B and 5D) delivered to an electrode within the processing system 10 to form plasma 101 during block 802. In one processing example, the frequency of the pulses provided within the voltage waveform at block 804 is between 50 to 500 kHz and the ion current stage of each pulse (e.g., low level portion of the pulse) can have a duration that is between 5 and 95% of the period of the pulse, such as between 50% and 95% of the period of the pulse.

Figure 5D:
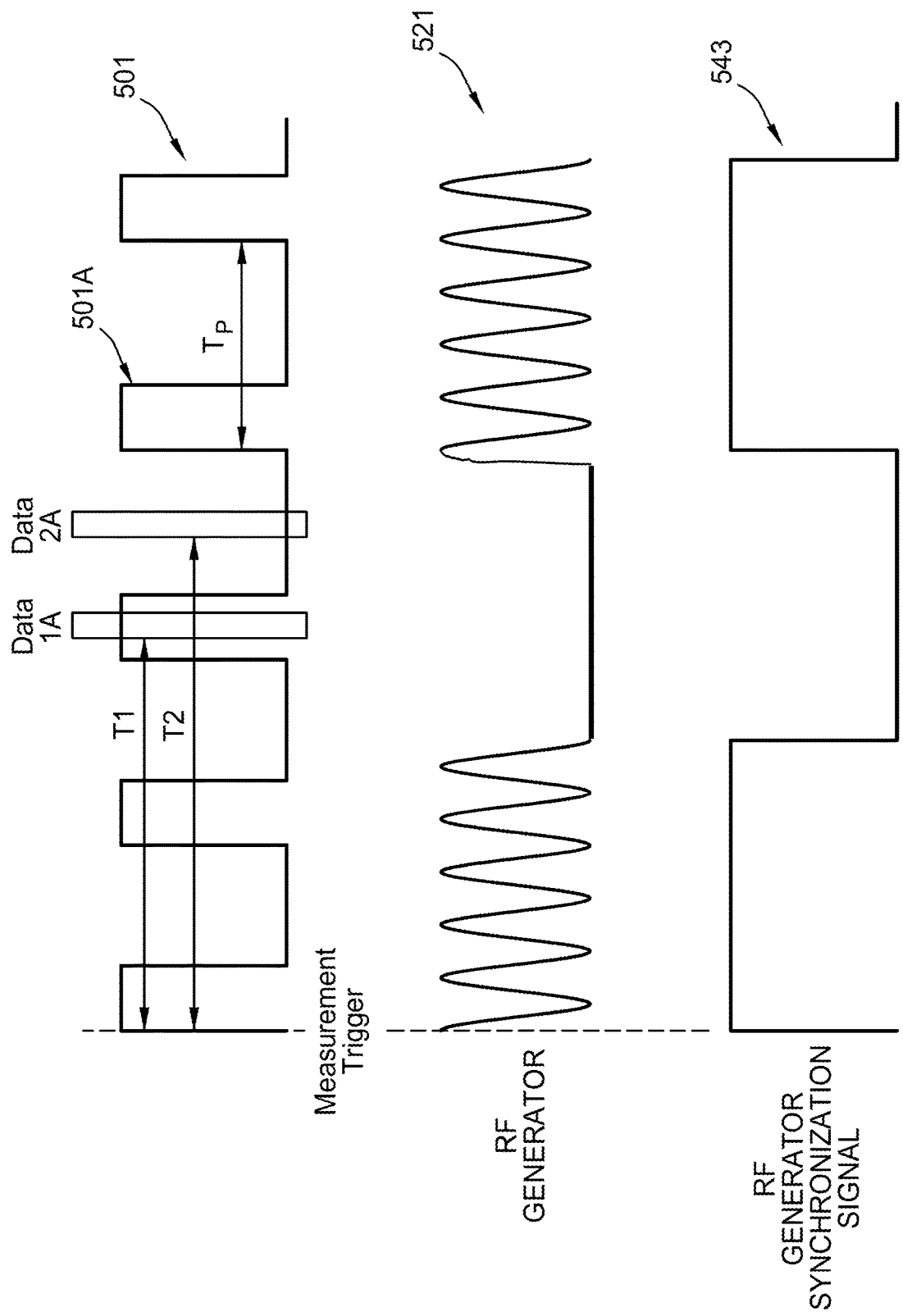
Figure 6:
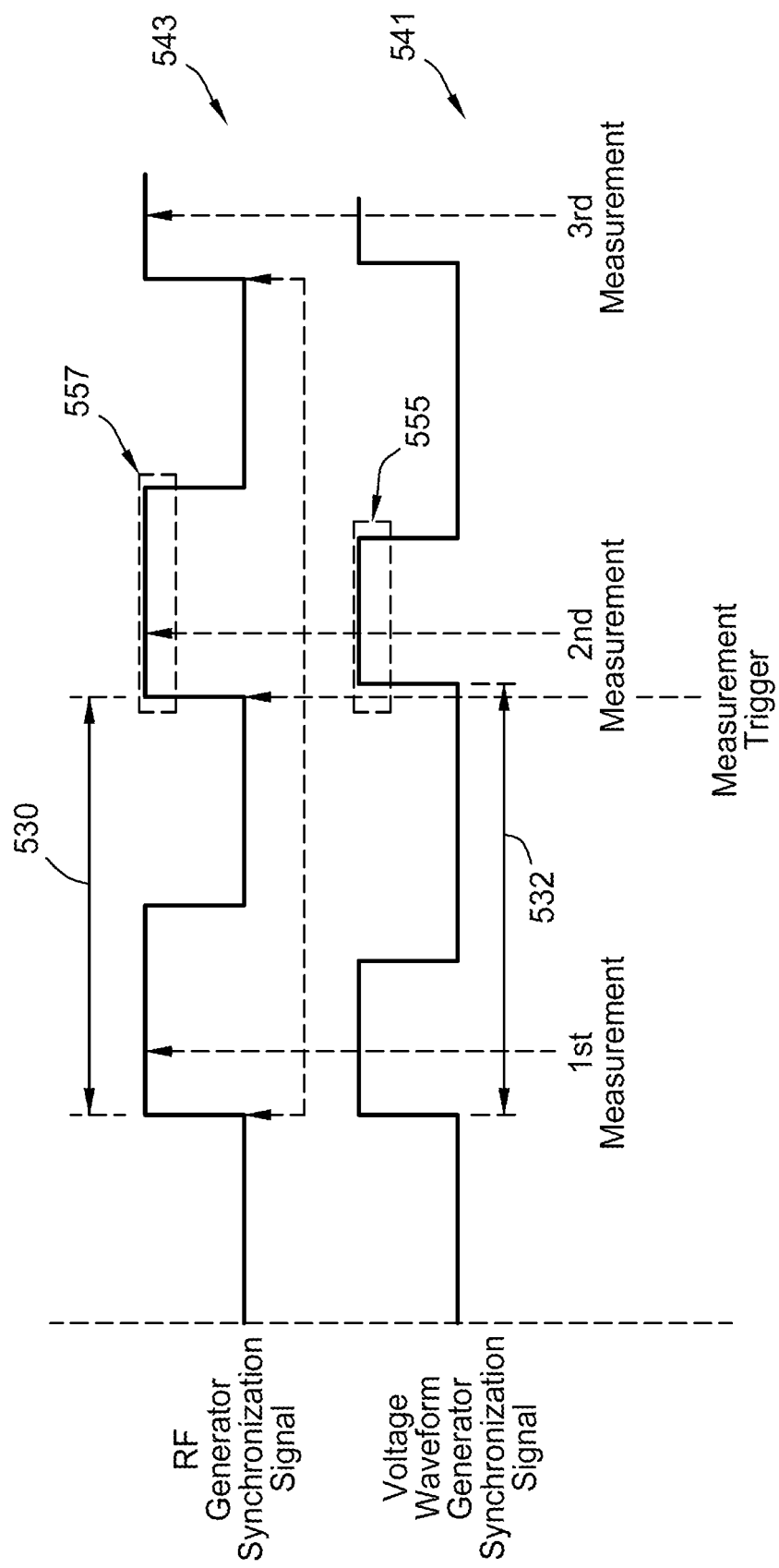
FIG. 6 illustrates multiple synchronization signals provided during plasma processing according to one or more embodiments.

At block 806 of method 800, the RF match 172 receives a synchronization signal 541 from the PV waveform generator 175 (FIG. 5B) and/or a synchronization signal 543 from the RF generator 171 (FIG. 5D). In one embodiment, during block 806, the RF generator 171 and the PV waveform generator 175 deliver synchronization signals, such as TTL signals to the RF match 172. The synchronization signals may be used to synchronize the measurement of one or more electrical parameters by the input sensor 116 and the output sensor 117, and may be used as a trigger to the RF match 172 to determine impedances of the plasma processing system 10.

At block 808 of method 800, as shown in FIGS. 5A-5B, the output sensor 117 samples a first set of impedance related data during a data interval 1A of the plasma processing system 10 over a first time period, as shown by the width of the vertically oriented rectangular box illustrated in FIG. 5A. The first set of impedance related data may be a set of one or more impedance related data parameters used to determine an impedance. As described above and generally used herein and below, a set of impedance related data, such as the first set of impedance related data, may include data relating to at least one of a voltage, current, phase, power, and combinations thereof. Due to the instability of the impedance of the complex load due to the application of the voltage waveform provided during block 804, it is desirable for the first impedance measurement, and all subsequent measurements, to be collected at a desirable time(s) within a portion of the repeated cycle of pulses 501A provided in the voltage waveform 501. In some embodiments, the first time period begins after a first delay time T1 triggered by the synchronization signal provided during block 806.

As illustrated in FIG. 5B, the PV waveform generator 175 synchronization signal 541 is synchronized with the voltage waveform 501. The PV waveform generator 175 synchronization signal 541 synchronizes the input sensor 116 and the output sensor 117. Also, a first portion of the of the PV waveform generator 175 synchronization signal 541 may be used to trigger the first delay T1. In one example, as shown in FIG. 5B, the first portion of the PV waveform generator 175 synchronization signal 541 delivered during block 806 may be created due to the detection of a rising edge of the of the PV generator waveform 175 synchronization signal 541. In other examples, the first portion of the synchronization signal delivered during block 806 may be created due the detection of a falling edge of the PV waveform generator 175 synchronization signal 541. Alternatively, the first delay T1 may be triggered by a significant change in the characteristics of the voltage waveform 501 or the RF waveform 521 (FIGS. 5B and 5D) detected by the sensors of the RF match 172. After the first delay time T1, the output sensor 117 samples the first set of impedance related data during the data interval 1A of the plasma processing system 10 over the first period of time and reports them to the RF match controller 302. In some cases, the first set of impedance related data collected by the output sensor 117 may be internally processed to form an average value of one or more of the electrical parameters that it detected over the first period of time, and the formed average value is sent to match controller 302 for use in block 809.

As illustrated in FIG. 5D, the RF generator 171 may transmit a synchronization signal 543 that is synchronized with the voltage waveform 501 and RF waveform 521. The RF generator 171 synchronization signal 543 synchronizes the input sensor 116 and the output sensor 117. In embodiments, the pulses of the RF generator 171 synchronization signal 543 are longer in length than the PV waveform generator 175 synchronization signal 541 (FIG. 5B). In some embodiments, the synchronization signal from the RF generator 541 is a macro pulse that has a period from 100 μs to 1 second and the PV waveform generator synchronization pulse cycles is from 0.1 μs to 100 μs. Also, a first portion of the of the RF generator 171 synchronization signal 543 may be used to trigger the first delay T1. In one example, as shown in FIG. 5D, the first portion of the RF generator 171 synchronization signal 543 delivered during block 806 may be created due to the detection of a rising edge of the of the RF generator 171 synchronization signal 543. In other examples, the first portion of the synchronization signal delivered during block 806 may be created due the detection of a falling edge of the RF generator 171 synchronization signal 543. Alternatively, the first delay T1 may be triggered by a significant change in the characteristics of the voltage waveform 501 or the RF waveform 521 (FIGS. 5B and 5D) detected by the sensors of the RF match 172. After the first delay time T1, the output sensor 117 samples the first set of impedance related data during the data interval 1A of the plasma processing system 10 over the first period of time and reports them to the RF match controller 302. In some cases, the first set of impedance related data collected by the output sensor 117 may be internally processed to form an average value of one or more of the electrical parameters that it detected over the first period of time, and the formed average value is sent to match controller 302 for use in block 809.

Although two data intervals are illustrated in each pulse period $T_p$ to determine a combined impedance parameter, the number of data intervals in each pulse period are not limited.

At block 809 of method 800, the RF match controller 302 determines a first impedance of the plasma processing system 10 based on the impedance related data collected during the data interval 1A. In some embodiments of block 809, the first impedance is determined by averaging the sampled impedances of the load (i.e. the impedance of the plasma processing system 10) in the processing volume 129 measured by the output sensor 117 during a first time period, which is illustrated as data interval 1A in FIGS. 5A and 5C. In one example, as shown in FIG. 5A, the first time period occurs during the sheath collapse stage. In some embodiments, the first impedance is determined by using the data collected by the output sensor 117 (e.g., voltage, current and/or phase) during block 808 and a look-up table or empirically determined equation stored in memory of the RF match controller 302 that equates the impedance related data to a known or empirically determined impedance.

At block 810 of method 800, as shown in FIGS. 5A-5B, a second set of impedance related data is collected during a data interval 2A by sampling the data over a second period of time after a second delay time T2 has elapsed. The second set of impedance related data may be a set of one or more impedance related data parameters used to determine an impedance. The second set of impedance related data may include at least one of impedance related parameters as found in the first set of impedance related data. As explained above, in some embodiments, the second delay time T2 is triggered simultaneously with the first delay time T1 (i.e., is triggered at the same time), and time delay to collect impedance related data during the data interval 2A is longer than the first delay time T1. In one example, as shown in FIGS. 5A and 5B, the second set of impedance related data collected during the data interval 2A may be determined over a second time period that occurs during the ion current stage of a pulse provided within a voltage waveform. The second time period for data collection, or data interval 2A, may be the same or a different duration than the first time period for data collection data interval 1A. In one example, the duration of the first time period and the second time period used to collect data interval 1A and data interval 2A is between 0.1 and 1 seconds. The first delay T1 and the second delay T2 may have durations between 0.005 to 10 μs.

At block 811 of method 800, the RF match controller 302 determines a second impedance of the plasma processing system 10 based on the impedance related data collected during the data interval 2A. The second impedance is determined in the same manner as the first impedance using the output sensor 117. In some cases, the second impedance is determined by use the data collected by the output sensor 117 (e.g., voltage, current and/or phase) and a look-up table or empirically determined equation stored in memory of the RF match controller 302. In some embodiments, the first delay time T1 and the second delay time T2 are configured so that they both fall into one or more portions of the same pulse 501A. However, the first delay time T1 and the second delay time T2 can alternately be configured so that collection of the impedance related data during the data interval 1A and data interval 2A falls within the same portion of two separate pules 501A. In one example, the first delay time T1 and the second delay time T2 are set such that they cause the data samples to both be taken during a point within the ion current stage of subsequent pulses 501A or even taken during the same point within two or more pulses within a series of pulses 501A by collecting data at an interval that is offset by an integer number of pulse periods $T_p$ (FIG. 5A), wherein the integer can be one or greater.

At block 812 of method 800, as shown in FIGS. 5A-B, a combined impedance parameter is determined based on the determined first and second impedances determined during blocks 808-811. For example, the combined impedance parameter may be determined by taking a weighted average between the first and second impedances determined in blocks 809 and 811. Based on the combined impedance parameter, the matching point of the RF match 172 is updated based on the combined impedance and thus is related to and is set due to the measured impedance of complex load. In other words, a first matching point of the RF match 172 is updated to a second matching point based on the combined impedance by making a tuning adjustment to one or more components in the RF Match 172, such as one or more of the variable capacitors in a tuning circuit 312 (e.g., capacitors $C_1$ and/or $C_2$ in FIG. 3B). The number of data intervals in each pulse period $T_P$ are not limited. For example, impedance related data may be collected in the same pulse period as data interval 1A and data interval 2A and may be used to determine the first combined impedance parameter. In some embodiments, a user can define how many data intervals are used for averaging the collected data, for example, 50 data intervals or 100 data intervals. In one example, a third data interval 3A after a third delay T3 may be located during each pulse period $T_P$. In another example, in a triple level pulsing case (not shown) impedance related data may be collected over a third data interval 3A after a third delay T3 that may be located in the third power level within a pulse. In one example, the data collected during the data intervals 1A, 2A and 3A may be averaged and used to tune the matching point in subsequent steps.

At block 814 of method 800, the matching point is adjusted by the RF match 172 to achieve the second matching point that is related to the impedance of the complex load as determined by the output sensor 117. For example, the RF match controller 302 may adjust the tuning circuit 312 to achieve the second matching point. This allows the RF match 172 to adjust its matching point as the load impedance fluctuates during plasma processing.

During block 816, optionally, after determining the combined impedance during block 812 and adjusting the match to the second match point, the RF match controller 302 further fine tunes the impedance of the RF match 172 to improve the impedance match of the RF waveform. During optional block 816, the input sensor 116 samples impedance related data of the RF waveform and reports them to the controller 302. Then, the RF match controller 302 further updates the second match point to a third match point and further adjusts the tuning circuit 312 based on the impedances of the RF waveform measured by the input sensor 116. In one example, the third match point is used to adjust the match so that the RF generator 171 sees a 50 Ohm load. In other embodiments, the third match point may be used to determine a new weighted impedance based on the impedance related data sampling during data 1A and 2A.

In some embodiments, the RF match 172 may maintain the second matching point for a predetermined period of time. For example, the PV waveform on time is usually much shorter than the motor response time to adjust the impedance of capacitive elements within the RF match 172, and therefore, a second match point may be kept unchanged during one or more PV waveform bursts. This process may be repeated for each burst on-time of the PV waveform. In some embodiments, the speed the third match point is adjusted is slower than the speed that the second match point is adjusted to avoid fluctuations in the match point. In some configurations, the third match point is selected based on a rolling average of measurements taken by the input sensor 116 during block 816.

In some embodiments, as one or more plasma processing variables are adjusted during a plasma process performed in the plasma processing chamber it may be desirable to perform the activities found within one or more of the blocks 802-814 again, such as performing blocks 806-814 at least one more time, before performing the activities within block 816 again. Typical plasma processing variables can include RF signal power level, chamber pressure, process gas composition, process gas flow rate, and voltage waveform characteristics (e.g., frequency, pulse on-time/duty cycle, voltage, etc.).

In some embodiments of the disclosure, the system controller 126 and RF match controller 302 are configured to collect the impedance related data and/or calculated impedance data collected during one or more of the various data intervals, store the impedance related data and/or calculated impedance data in memory, and generate a report or file and/or display the impedance related data and/or calculated impedance data on a graphical user interface (GUI) of a user PC (FIG. 3A) so that a user can review and judge the status of the plasma processing system. In one example, the sensors 116, 117 and RF match controller 302 are used to provide information to the system controller 126 so that an algorithm running on the system controller 126 can then be used to generate real time plots of one or more of the impedance related data and/or calculated impedance data so that the user can use the generated information for optimization and diagnostics purposes. The plots can include time domain plots of impedance, voltage, current, phase, or other useful measurement (e.g., match temperature, chamber pressure, gas flow rate, frequency) that are provided to the user via a display, stored in an electronic file and/or printed out.

Additional Processing Examples

Figure 8B:
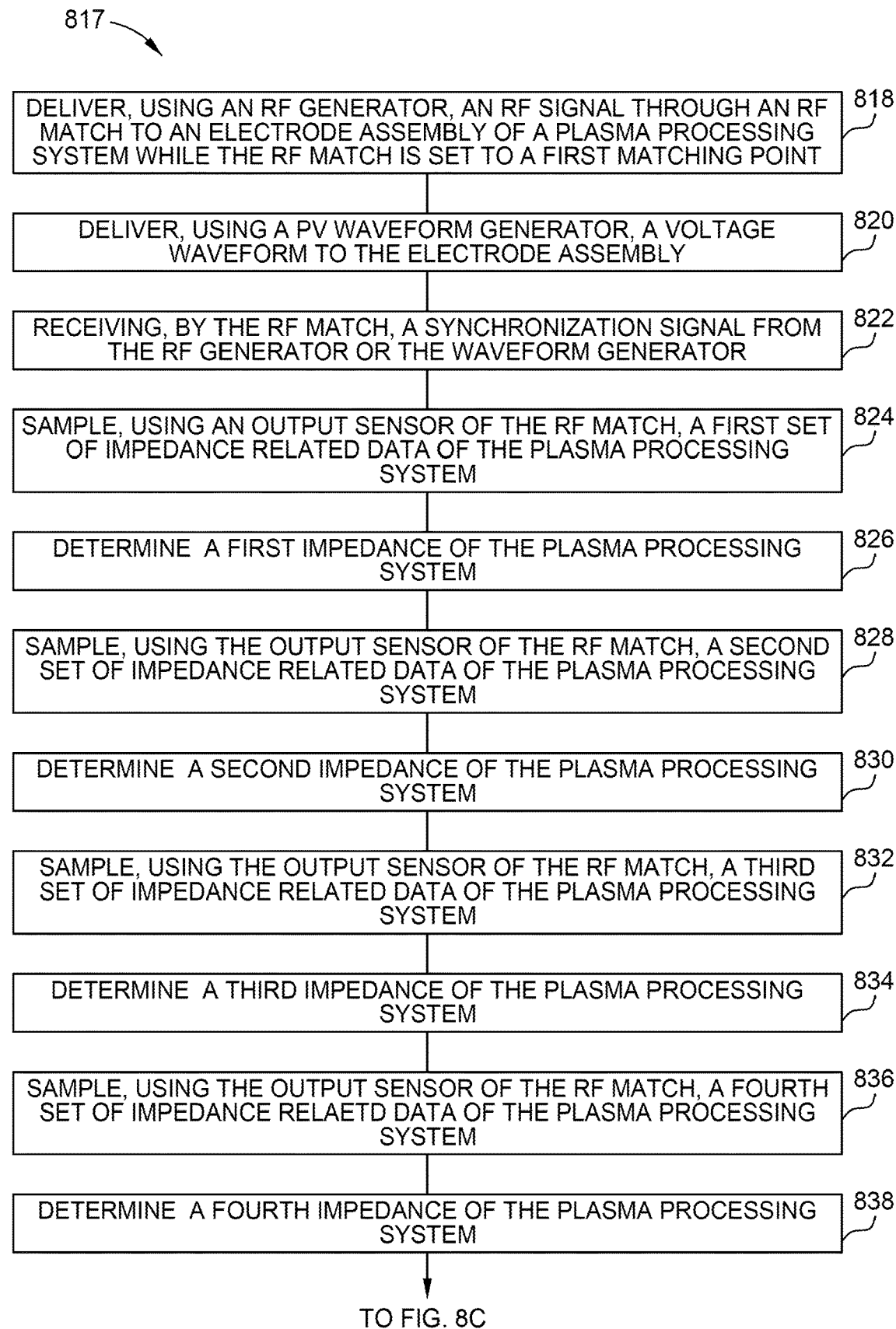
Figure 8C:
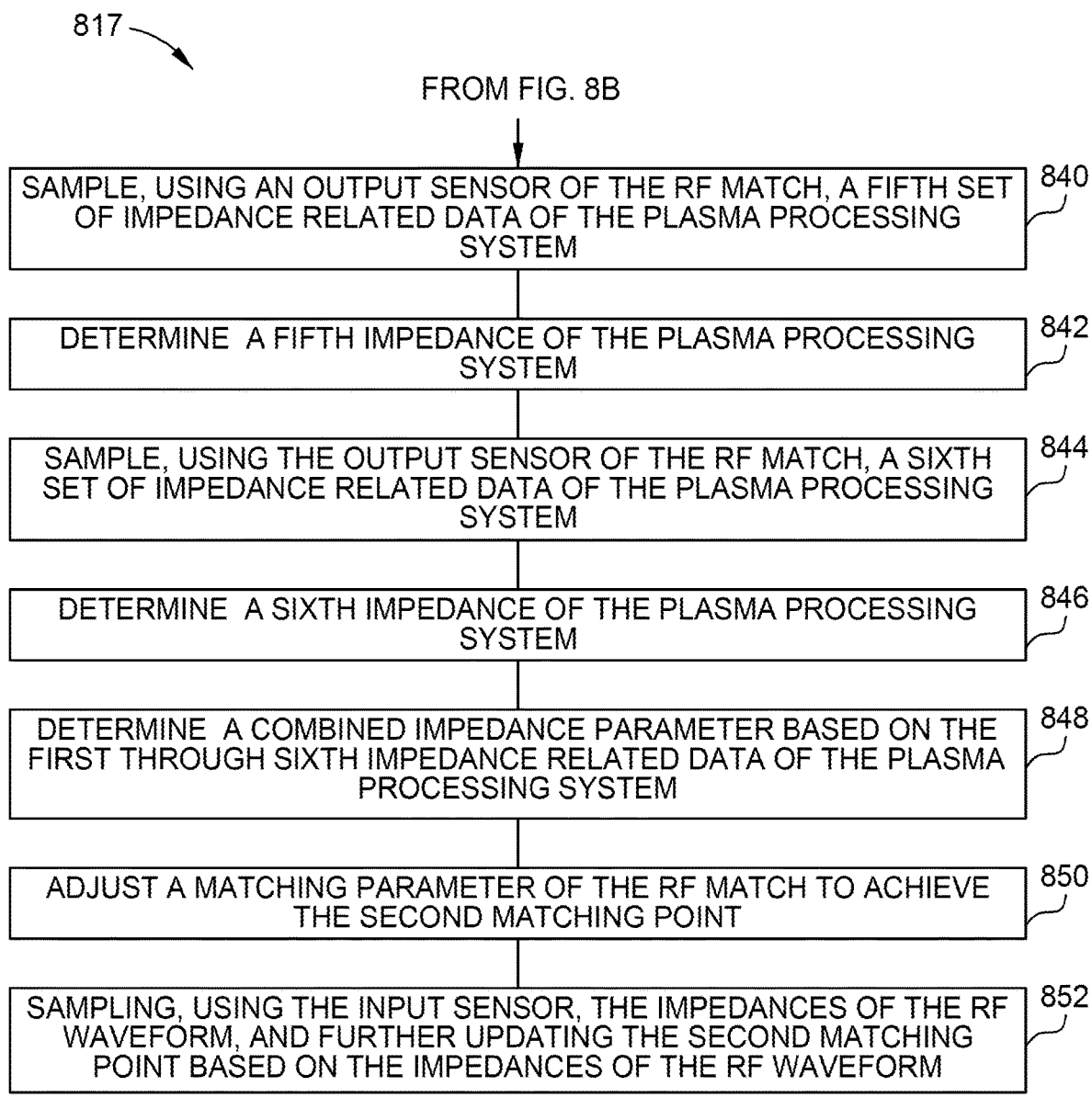

FIGS. 8B-8C illustrate a method 817 of using an RF a plasma processing system (e.g., plasma processing system 10 FIGS. 1 and 2) according to certain embodiments. Method 817 is performed by processing logic that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 817 is performed, in part, by controller device (e.g., system controller 126 of FIGS. 1 and 2 and/or RF match controller 302 of FIG. 3A). In some embodiments, a non-transitory storage medium stores instructions that when executed by the controller device cause the controller device to perform method 817. For simplicity of explanation, method 817 is depicted and described as a series of operations. However, operations in accordance with this disclosure can occur in various orders and/or concurrently and with other operations not presented and described herein. Furthermore, in some embodiments, not all illustrated operations are be performed to implement method 817 in accordance with the disclosed subject matter. In addition, those skilled in the art will understand and appreciate that method 817 could alternatively be represented as a series of interrelated states via a state diagram or events.

At block 818 of method 817, an RF generator 171 delivers an RF signal through an RF match 172 to an electrode assembly disposed within a plasma processing system 10 to form plasma 101. The RF signal is delivered to the electrode assembly at a first matching point set by the RF match 172 in the same manner described in block 802 of method 800 above.

At block 820 of method 817, the PV waveform generator 175 delivers a voltage waveform 501 that includes a plurality of pulses that each have a pulse period $T_P$ to an electrode disposed within the plasma processing system 10, as shown in FIGS. 1-2 and 5A-5C. The plurality of pulses are simultaneously provided with the RF signal delivered to an electrode within the processing system 10 to form plasma 101 during block 818, as similarly described above in block 804.

At block 822 of method 817, the RF match 172 receives the synchronization signal(s) from the RF generator 171 and/or the PV waveform generator 175. The synchronization may be delivered and used in the same manner described above in block 806 of method 800.

At block 824 of method 817, as shown in FIGS. 5A-5C, the output sensor 117 samples a first set of impedance related data during the data interval 1A of the plasma processing system 10 over a first period of time and reports them to the RF match controller 302. The first set of impedance related data collected during the data interval 1A are sampled and/or processed in the same manner described above in block 808 of method 800.

At block 826 of method 817 as shown in FIGS. 5A-5C, the RF match controller 302 determines a first impedance of the plasma processing system 10 based on the impedance related data collected during the data interval 1A, as similarly discussed above in block 809 of method 800. For example, the RF match controller 302 may determine the first impedance by averaging the sampled impedance related data collected during the data interval 1A.

At block 828 of method 817, as shown in FIGS. 5A-5C, the output sensor 117 samples a second set of impedance related data collected during the data interval 2A over a second period of time and reports them to the RF match controller 302. The second set of impedance related data collected during the data interval 2A are sampled in the same manner described above in block 810 of method 800.

At block 830 of method 817, as shown in FIGS. 5A-5C, the RF match controller 302 determines a second impedance of the plasma processing system 10 based on the impedance related data collected during the data interval 2A, as similarly discussed above in block 811 of method 800. For example, the RF match controller 302 may determine the second impedance by averaging the sampled impedance related data collected during the data interval 2A.

At block 832 of method 817, as shown in FIG. 5C, after collecting the impedance related data during the data interval 1A and data interval 2A the RF match controller 302 may sample a third set of impedance related data during the data interval 1B of the plasma processing system 10 sampled over a third period of time after a third delay T3. The third delay T3 may be triggered in the same manner as the first delay T1 and the second delay T2. In one example, the third delay T3 is equal to the first delay plus the period of a pulse $T_p$. The third set of impedance related data may be a set of one or more impedance related data parameters used to determine an impedance. The third set of impedance related data may include at least one of impedance related parameters as found in the first and second sets of impedance related data.

At block 834 of method 817, as shown in FIGS. 5A-5C, the RF match controller 302 determines a third impedance of the plasma processing system 10 based on the data collected during data interval 1B. For example, the RF match controller 302 may determine the third impedance by averaging the sampled impedance related data collected during the data interval 1B.

At block 836 of method 817, as shown in FIG. 5C a fourth set of impedance related data is collected during the data interval 2B by sampling over a fourth period of time after a fourth delay T4. The fourth delay T4 may be triggered in the same manner as the first delay T1, the second delay T2, and the third delay T3. The fourth delay T4 is equal to the second delay T2 plus the period of a pulse. In some embodiments, based on the characteristics measured by the output sensor 117, an error correction time may be added to the third and fourth delay T4. The fourth set of impedance related data may be a set of one or more impedance related parameters used to determine an impedance. The fourth set of impedance related data may include at least one of the impedance related parameters as found in the first, second, and third sets of impedance related data.

At block 838 of method 817 as shown in FIGS. 5A-5C, the RF match controller 302 determines a fourth impedance of the plasma processing system 10 based on the impedance related data collected during the data interval 2B. For example, the RF match controller 302 may determine the fourth impedance by averaging the sampled impedance related data collected during the data interval 2B.

At block 840 of method 817, as shown in FIG. 5C, a fifth set of impedance related data is collected during the data interval 1C of the plasma processing system 10 by sampling over a fifth period of time after a fifth delay T5. The fifth delay T5 may be triggered in the same manner as the first through fourth delays T1-T4. The fifth delay T5 is equal to the first delay T1 plus two times a period of the pulse. As explained above, an optional error factor may be added to the fifth delay T5. The fifth set of impedance related data may be a set of one or more impedance related data parameters used to determine an impedance. The fifth set of impedance related data may include at least one of the impedance related parameters as found in the first, second, third, and fourth sets of impedance related data.

At block 842 of method 817 as shown in FIGS. 5A-5C, the RF match controller 302 determines a fifth impedance of the plasma processing system 10 based on the impedance related data collected during the data interval 1C. For example, the RF match controller 302 may determine the fifth impedance by averaging the sampled impedance related data collected during the data interval 1C.

At block 844 of method 817, as shown in FIG. 5C, a sixth set of impedance related data collected during the data interval 2C of the plasma processing system 10 are sampled over a sixth period of time after a sixth delay T6. The sixth delay T6 may be triggered in the same manner as the first through fifth delays T1-T5. The sixth delay T6 is equal to the second delay T2 plus two times a period of the pulse. As explained above, an optional error factor may be added to the sixth delay T6. The sixth set of impedance related data may be a set of one or more impedance related data parameters used to determine an impedance. The sixth set of impedance related data may include at least one of the impedance related parameters as found in the first, second, third, fourth, and fifth sets of impedance related data.

At block 846 of method 817 as shown in FIG. 5C, the RF match controller 302 determines a sixth impedance of the plasma processing system 10 based on the impedance related data collected during the data interval 2C. For example, the RF match controller 302 may determine the sixth impedance by averaging the sampled impedance related data collected during the data interval 2C.

In some embodiments, based on the characteristics measured by the output sensor 117 an error correction time may be added to a time delay by the RF match controller 302 to ensure that the time delay and subsequent measurements are made within a desired portion of each subsequent voltage pulse. In some embodiments, the correction time, which may be a small percentage of the pulse period $T_p$ (e.g., <10%), can be adjusted by an optimization process that is performed to minimize the variation in the data used to determine an impedance of a load based a group of similar measurements performed within the same portion of a plurality of pulses. In one example, a plurality of data measurements are performed at slightly shifted intervals within a desired portion of a plurality of pulse, such as data intervals 1A, 1B and 1C are shifted from each other by a fixed time (e.g., 1 µs). During this process the variation in the measured data (e.g., current, voltage, etc.) is determined in each of the measured data intervals 1A, 1B, and 1C intervals to find which of the measurements had the smallest variation so that subsequent measurements can then be made at the same corrected time delay within each subsequent pulse.

As described above, collection of impedance related data may be triggered by a rising edge or a falling edge of synchronization signals from either the RF generator 171 and/or the PV waveform generator 175. Multiple data intervals of impedance related data may be collected during each pulse voltage $T_P$. The number of data intervals within each pulse period $T_P$ is not limited. Also the duration/width of each data interval is not limited. The impedance related data collected during each data interval may include, the voltage, current, phase, etc. Then a combined impedance parameter may be determined based on the impedance related data which may be used to adjust the matching point of the RF match 172. In one example, collection of the impedance related data may be triggered by a rising edge of a synchronization signal transmitted by the RF generator 171.

At block 848 of method 817, a combined impedance parameter is determined based on the determined first through sixth second impedances. Based on the combined impedance parameter, the matching point of the RF match 172 is updated based on the combined impedance. In other words, a first matching point of the RF match 172 is updated to a second matching point based on the combined impedance.

In one example, the combined impedance may be a combination of the first through sixth impedances. The combined impedance may be determined by taking a weighted average of the first through sixth impedances. In another example, a first combined impedance determined by combining the first impedance and the second impedance may be combined with a second combined impedance determined by combining the third impedance and the fourth impedance and a third combined impedance determined by combining the fifth impedance and the sixth impedance is used as the combined impedance. This process may be repeated for each subsequent pulse period $T_p$. As explained above, the first combined impedance may be determined by taking a weighted average of the first and second impedances. The second combined impedance may be determined by taking a weighted average of the third and fourth impedances. The third combined impedance may be determined by taking a weighted average of the fifth and sixth impedances. Then the combined impedance may be determined by taking a weighted average of the first through third combined impedances.

Alternatively any number of periods of pulses that occur during the burst-on time of the PV waveform may be used. For example, two pulses may be used to determine the combined impedance parameter, and the combined impedance may be determined based on the first through fourth sets of data intervals 1A-2B. In another example, the pulses used to determine the combined impedance parameter may not be consecutive. For example, the combined impedance parameter may be determined based on the first and second sets of impedance related data collected during the data interval 1A and data interval 2A and the fifth and sixth sets of impedance related data collected during the data interval 1C and data interval 2C.

At block 850 of method 817, based on the combined impedance parameter, the matching point of the RF match 172 is updated based on the combined impedance. In other words, the first matching point of the RF match 172 is updated to the second matching point based on the combined impedance.

During optional block 852, after determining the combined impedance during block 848, the RF match controller 302 may optionally further fine tune the impedance of the RF match 172 to improve the impedance match of the RF waveform. The input sensor 116 samples impedance related data of the RF waveform and reports them to the controller 302. Then, the RF match controller 302 further updates the matching point and further adjusts the tuning circuit 312 based on the impedances of the RF waveform. These processes may be repeated for each burst on-time of the PV waveform.

FIG. 6 shows an example multiple synchronization signals configured to trigger different components of the RF match 172. As explained above, impedance measurements may be determined by each sensor after a delay triggered by a synchronization signal. Each sensor may receive a same synchronization signal or a different synchronization signal. In some embodiments, the input sensor 116 and the output sensor 117 may use different synchronization signals to trigger data collection. For example, the RF generator 171 synchronization signal 543 may be transmitted to the input sensor 116 and may be used to trigger the input sensor 116 to collect impedance related data while the PV waveform generator 175 synchronization signal 541 may be transmitted to the output sensor 117 and may be used to trigger the output sensor 117 to collect impedance related data (or vice versa).

The PV waveform generator 175 synchronization signal 541 may comprise a plurality of pulses 555. For example, a rising edge of pulses 555 may trigger the output sensor 117 to collect impedance related data of the plasma processing system 10, determine an impedance measurement (i.e., a combined impedance parameter), and transmit the combined impedance parameter to the RF match controller 302. Then the RF match controller 302 may determine an updated matching point and adjust the RF match 172 to achieve the updated matching point. Stated otherwise, and as explained above, impedance related data may be collected after delays triggered by each rising edge, a combined impedance measurement may be determined during the pulses 555 of the PV waveform generator 175 synchronization signal 541, and the matching point of the RF match 172 may be updated during the pulses 555. A combined impedance measurement may be determined during each pulse period 532 of the PV generator waveform 175 synchronization signal 541. A first measurement may be determined during a first pulse, a second measurement may be determined during a second pulse, a third measurement may be determined during a third pulse and so on. On the other hand, a falling edge of the PV waveform generator 175 synchronization signal 541 may be used to trigger the output sensor 117 to collect impedance related data and determine a combined impedance parameter during rest time between each of the pulses 555.

The RF generator 171 synchronization signal 543 may comprise a plurality of pulses 557. A rising edge of the pulses 557 may trigger the input sensor 116 to sample impedances of the RF waveform 521 (FIGS. 5B and 5D) that are used to further update the matching point of the RF match 172 determined based the impedance related data sampled by the output sensor 116. For example, after updating the matching point of the RF match 172 based on the impedance measurements of the output sensor, the matching point is further updated during each pulse period 530 based on the impedances sampled by the input sensor 116. On the other hand, a falling edge of the pulses 557 may be used to trigger the input sensor 117 to collect impedance related data of the RF waveform 521 during rest time between pulses of the RF generator 171 synchronization signal 543.

Figure 9:
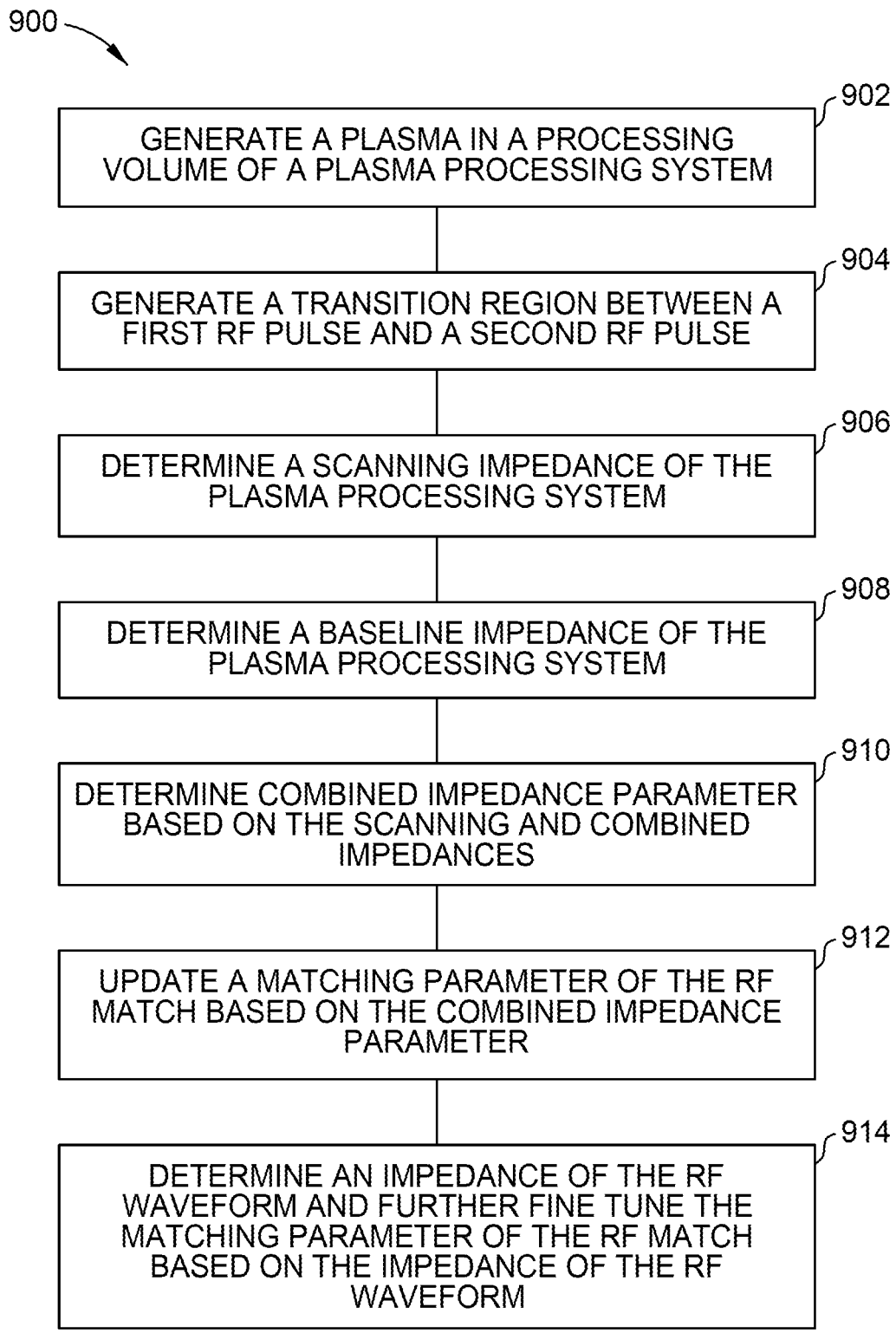
FIG. 9 illustrates a method of using an RF plasma processing system when a plurality of RF pulses are provided to an electrode of the plasma processing system, according to certain embodiments.

FIGS. 7 and 9 illustrate a method for using the RF match 172 to sample changes in the impedance of the load generated by the plasma 101 where a pulsed RF signal is used to form a plasma 101.

Figure 7A:
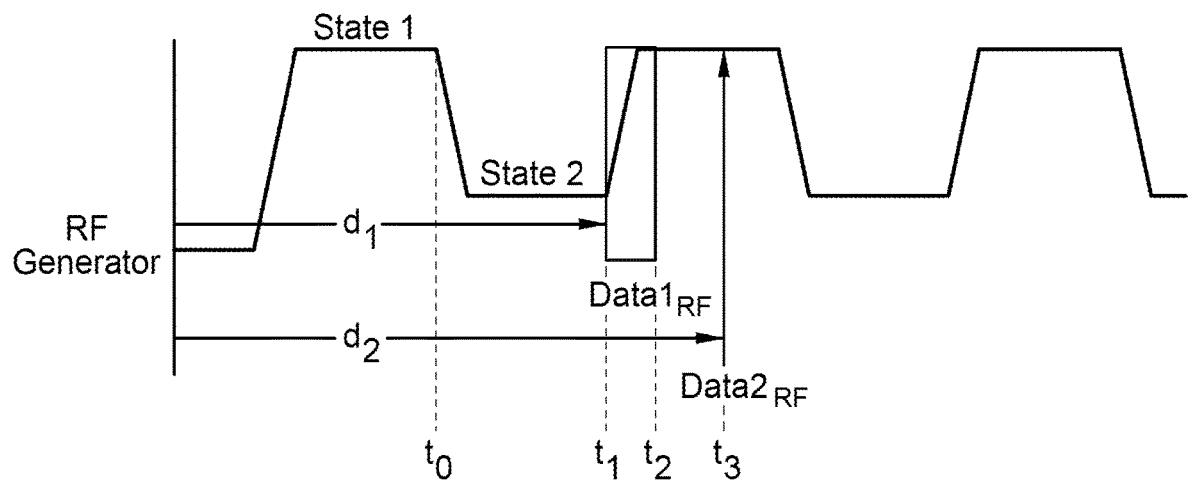
FIG. 7A illustrates a plurality of RF pulses that are provided to an electrode during plasma processing, according to one or more embodiments.

FIG. 7A illustrates a plurality of RF pulses that are provided to an electrode during plasma processing, according to one or more embodiments. Referring to FIG. 7A, the output sensor of the RF match 172 collects impedance related data during a portion of an RF waveform generated by the RF generator 171 that is in a pulsing mode. In one example of a pulsing mode, as shown in FIG. 7A the plasma 101 is generated by sequentially delivering a first RF pulse state and a second RF pulse state. The first RF pulse state is delivered at a first power level state and the second pulse state is delivered at a second power level state. In one example, as shown in FIG. 7A, the first power level state is a higher power level than the second power level state, and transitions from the first power level state to the second power level state at a time to. In other embodiments the first power level state may be lower than the second power level state.

In one embodiment, the RF match 172 determine a match point by combining impedance related data collected during the data interval $1_{RF}$ of the plasma processing system 10 as the RF waveform transitions between second RF pulse state and the first RF pulse state and a baseline data interval $2_{RF}$ sampled while the RF waveform is in the second RF pulse state (or first RF pulse state). For example, the scanning impedances of the plasma processing system 10 are sampled between a first time t1 and a second time t2 while the RF waveform transitions from first RF pulse state to the second RF pulse state (or vice versa). The baseline impedance data is sampled at a time t3 while the RF waveform is in the first state.

The scanning impedances of the plasma processing system 10 may be sampled by the output sensor 117 and reported to the RF match controller 302 in the same manner explained above. The sampling of impedance related data collected during the data interval $1_{RF}$ may be triggered by a first time delay d1 and the sampling of impedance related data collected during the data interval $2_{RF}$ may be triggered by a second time delay d2. The first time delay d1 and the second time delay d2 may be triggered in the same manner described above. The first time delay d1 is a variable time delay and may be shifted between state changes based on the characteristics sampled by the input sensor 116 to ensure that data1 only includes impendences during the transition between states. The second delay d2 can be fixed. Further, based on the impedances or other characteristics of the RF waveform sampled by the output sensor 117, the duration between the first time t1 and the second time t2 may be adjusted between state changes to ensure sampling impedances are only sampled during the transition between states.

Figure 7B:
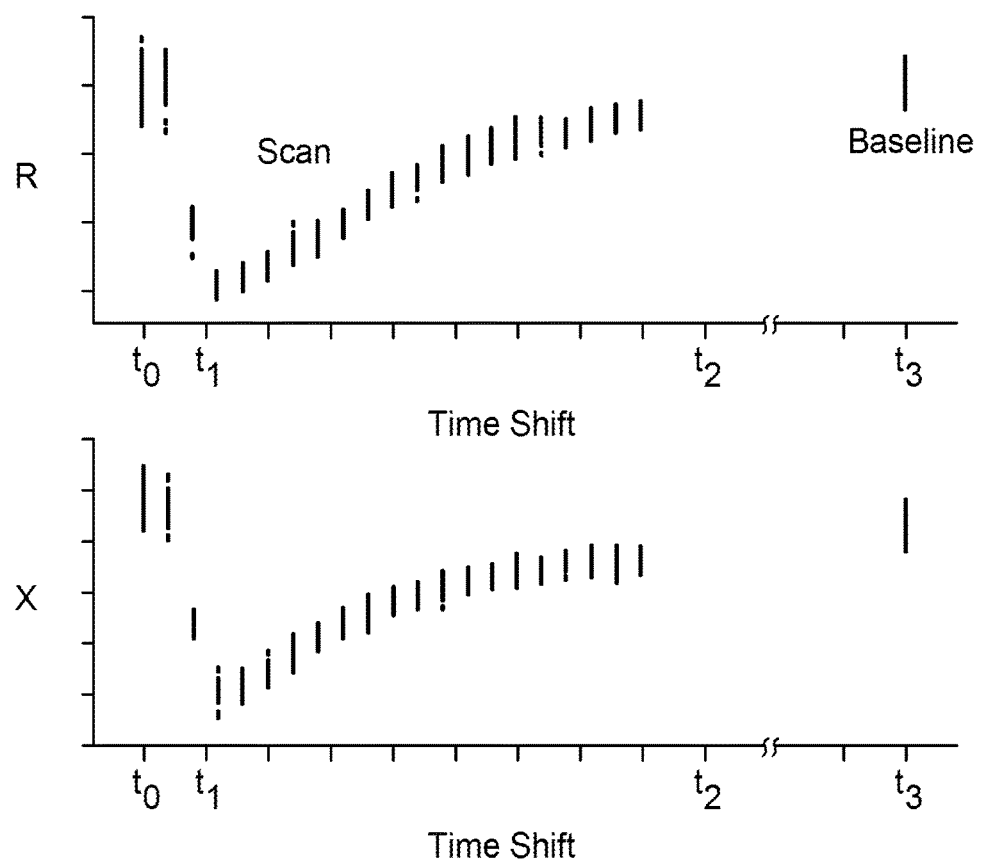
FIG. 7B illustrates an example of measured values of resistance (R) and reactance (X) created by the delivery of an RF pulse to a complex load as a function of time during plasma processing, according to one or more embodiments.

FIG. 7B illustrates an example of measured values of resistance (R) and reactance (X) created by the delivery of an RF pulse to a complex load as a function of time during plasma processing, according to one or more embodiments. Referring to FIG. 7B, the input sensor 116 and the output sensor 117 are sensors that are configured to measure parameters that are used to determine a complex impendence (X). The sensors are configured to simultaneously measure the resistance of the plasma processing system 10 and a non-real component of the plasma processing system 10 which includes a capacitive element ($X_C$) or an inductive element ($X_L$). Then based on the resistance (i.e., the real component), and the non-real component the sensors can scan and report impendences to the controller 302.

FIG. 9 illustrates a method 900 of using an RF a plasma processing system when a plurality of RF pulses are provided to an electrode of the plasma processing system, according to certain embodiments. For simplicity of explanation, method 900 is depicted and described as a series of operations. However, operations in accordance with this disclosure can occur in various orders and/or concurrently and with other operations not presented and described herein. Furthermore, in some embodiments, not all illustrated operations are be performed to implement method 900 in accordance with the disclosed subject matter. In addition, those skilled in the art will understand and appreciate that method 900 could alternatively be represented as a series of interrelated states via a state diagram or events.

At block 902 of method 900, a plasma 101 is generated in a processing volume 129 of the plasma processing system 10. As explained above, in one example, generating the plasma 101 includes delivering an RF waveform that includes sequentially delivering a series of first RF pulses that are each separated by a second RF pulse. As illustrated in FIGS. 7A-B, the first and second RF pulses are generated by the RF generator 171 delivering an RF signal via an RF match 172 to an electrode assembly. The first RF pulse is delivered at a first power level state $1_{RF}$ (i.e., state 1) and the second pulse is delivered at a second power level state $2_{RF}$ (i.e., state 2). In general, the RF waveform is delivered to the electrode assembly at a first matching point set by the RF match 172. In some embodiments, the settings of the various components within the RF match 172, such as a variable capacitor in the tuning circuit 312, that are used to achieve the first matching point is based on a prior calibration process or knowledge of the similar systems, and is preset and stored in memory for use as a starting point by the controller 302 within the RF match 172.

At block 904, of method 900, as shown in FIGS. 7A-B, a transition region between the first RF pulse and the second RF pulse is determined by the controller 302 of the RF match 172. In some embodiments, the start or end of the transition region is used by the match controller 302 as a trigger to detect the impedance related data during a portion of RF waveform that includes the first RF pulse and second RF pulse. In one example, a trigger is detected at the start of a transition region found at time $t_1$, which is illustrate in FIG. 7A-7B.

At block 906 of method 900, as shown in FIGS. 7A-B, the RF match 172 determines a scanning impedance of the plasma processing system 10 during the transition region between the first RF pulse and the second RF pulse. The scanning impedance is created by detecting one or more of the impedance related data collected by the output sensor 117 during a data interval of a desired length within at least a portion of the transition region (e.g., time t2 minus time $t_1$). The RF match controller 302 may determine a scanning impedance value by averaging the sampled impedance related data collected during the defined data interval.

At block 908 of method 900, as shown in FIGS. 7A-B, the RF match 172 determines a baseline impedance of the plasma processing system 10 during either the first pulse or the second pulse. The baseline impedance is created by detecting one or more of the impedance related data by the output sensor 117 during a portion of the first or second pulse (e.g., time t3).

At block 910 of method 900, as shown in FIGS. 7A-B, the controller 302 of the RF match 172 determines a combined impedance parameter based on the detected scanning impedance and the baseline impedance. For example, the RF match 172 may determine the combined impedance parameter by taking a weighted average between the scanning impedance and the baseline impedance.

At block 912 of method 900, the RF match 172 updates its matching parameter by updating its matching point based on the combined impedance, and adjusting the tuning circuit 312 accordingly. In other words, a first matching point of the RF match 172 is updated to a second matching point based on the combined impedance by making a tuning adjustment to one or more components in the RF Match 172, such as one or more of the variable capacitors in a tuning circuit 312 (e.g., capacitors $C_1$ and/or $C_2$ in FIG. 3B).

During block 914, after determining the combined impedance during block 912, the RF match controller 302 further fine tunes the impedance of the RF match 172 to improve the impedance match of the RF waveform. The input sensor 116 samples impedance related data of the RF waveform and reports them to the controller 302. Then, the RF match controller 302 further updates the matching point to a third matching point by further adjusting the tuning circuit 312 based on the detected impedance of the RF waveform. This processes may be repeated for each portion of the RF waveform. In various embodiments, other possible options for updating the variable capacitor position of the RF match includes using theoretical calculation or a lookup table, based on the combined impedance parameter.

As noted above, embodiments of the present disclosure include an apparatus and methods for synchronizing and controlling the delivery of an RF bias voltage to one or more electrodes disposed within a plasma processing chamber to better control the efficient delivery of RF power to a plasma formed in the processing region of a plasma processing chamber.

What is claimed is:

1. A method of processing a substrate in a plasma processing system, comprising:
   delivering an RF signal, by an RF generator, through an RF match to an electrode assembly disposed within the plasma processing system, wherein while delivering the RF signal the RF match is set to a first matching point;
   delivering a voltage waveform, by a waveform generator, to the electrode assembly disposed within the plasma processing system while the RF signal is delivered to the electrode assembly;
   receiving, by the RF match, a synchronization signal from a RF generator or the waveform generator;
   measuring, by an output sensor of the RF match, a first set of impedance related data of the plasma processing system over a first time period, the first time period beginning after a first delay triggered by a first portion of a first waveform pulse of the synchronization signal;
   measuring, by the output sensor of the RF match, a second set of impedance related data of the plasma processing system over a second time period, the second time period beginning after a second delay triggered by the first portion of the first waveform pulse of the synchronization signal;
   calculating, by the RF match, a combined impedance parameter based on the measured first set of impedance related data and the measured second set of impedance related data; and
   adjusting a matching parameter within the RF match based on the calculated combined impedance parameter to achieve a second matching point.

2. The method of claim 1, wherein the first time period and the second time period have equal durations.

3. The method of claim 1, wherein calculating the combined impedance parameter comprises calculating a weighted average between the first set of impedance related data and the second set of impedance related data.

4. The method of claim 1, wherein the synchronization signal from the RF generator and the synchronization signal from the waveform generator are transistor-transistor logic (TTL) synchronization signals.

5. The method of claim 1, further comprising:
   after adjusting the matching parameter within the RF match, measuring, by an input sensor of the RF match, an impedance of the RF signal;
   further adjusting the matching parameter within the RF match based on a measured impedance of the RF signal to achieve a third matching point.

6. The method of claim 1, wherein the first set of impedance related data is determined by averaging the measured set of first impedance related data during the first time period, and the second set of impedance related data is determined by averaging the measured set of impedance related data the second time period.

7. The method of claim 1, wherein the first time period occurs while the plasma processing system is in a sheath collapse stage of processing, and the second time period occurs while the plasma processing system is in an ion current stage of processing.

8. The method of claim 1, wherein the first time period and the second time period occur during a same period of the voltage waveform.

9. The method of claim 1, further comprising:
   measuring, by the output sensor of the RF match, a third set of impedance related data of the plasma processing system over a third time period, the third time period beginning after a third delay beginning at a same time as the first delay;
   measuring, by the output sensor of the RF match, a fourth set of impedance related data of the plasma processing system over a fourth time period, the fourth time period beginning after a fourth delay beginning at a same time as the first delay; and
   calculating, by the RF match, the combined impedance parameter based on the measured first set of impedance related data, the measured second set of impedance related data, the measured third set of impedance related data, and the measured fourth set of impedance related data.

10. The method of claim 9, wherein the first time period and the second time period occur during a first period of the voltage waveform, and the third time period and the fourth time period occur during a second period of the voltage waveform.

11. A method of processing a substrate in a plasma processing system comprising:
   generating a plasma in a processing volume of the plasma processing system, wherein
      generating the plasma by delivering an RF waveform that comprises sequentially delivering a first RF pulse and a second RF pulse;

the first RF pulse comprises a first RF power level and the second RF pulse comprises a second RF power level; and the sequentially delivered first and second RF pulses are formed by delivering an RF signal through an RF match and to an electrode assembly of the plasma processing system;

detecting a transition region between the first RF pulse and the second RF pulse;

determining a scanning impedance of the plasma processing system during the transition region between the first RF pulse and the second RF pulse;

determining a baseline impedance of the plasma processing system during the first RF pulse or the second RF pulse; and calculating a combined impedance parameter based on the scanning impedance and the baseline impedance.

12. The method of claim 11, wherein the second RF power level is zero or is less than the first RF power level.

13. The method of claim 12, wherein the scanning impedance is an average impedance of the plasma processing system during a rising edge or a falling edge that extends between the first RF power level and the second RF power level.

14. The method of claim 13, wherein the baseline impedance is an impedance of the plasma processing system at the second RF power level.

15. The method of claim 13, wherein the baseline impedance is an impedance of the plasma processing system at the first RF power level.

16. The method of claim 11, wherein while delivering a first RF pulse of the RF waveform through an RF match the RF match is set to a first matching point; and the method further comprises:

adjusting a matching parameter within the RF match based on the calculated combined impedance parameter to achieve a second matching point that is different from the first matching point.

17. A plasma processing system comprising:

an RF generator configured to deliver an RF signal through an RF match to an electrode assembly disposed within the plasma processing system, wherein while delivering the RF signal the RF match is set to a first matching point;

a voltage waveform generator configured to deliver a voltage waveform to the electrode assembly disposed within the plasma processing system while the RF signal is delivered to the electrode assembly, the RF match comprising:

an input sensor;

an output sensor;

an RF match controller; and a memory for storing a program to be executed in the RF match controller, the program comprising instructions when executed cause the RF match controller to:

receive, by the RF match, a synchronization signal from a RF generator or the waveform generator;

measure, using the output sensor, a first set of impedance related data of the plasma processing system over a first time period, the first time period beginning after a first delay triggered by a first portion of a first waveform pulse of the synchronization signal;

measure, using the output sensor of the RF match, a second set of impedance related data of the plasma processing system over a second time period, the second time period beginning after a second delay triggered by the first portion of the first waveform pulse of the synchronization signal;

calculate, by the RF match controller, a combined impedance parameter based on the measured first set of impedance related data and the measured second set of impedance related data; and adjust a matching parameter within the RF match based on the calculated combined impedance parameter to achieve a second matching point.

18. The plasma processing system of claim 17, wherein the program further comprises instructions to:

after adjusting the matching parameter within the RF match, measure, by the input sensor of the RF match, an impedance of the RF signal; and further adjusting the matching parameter within the RF match based on a measured impedance of the RF signal to achieve a third matching point.

19. The plasma processing system of claim 17, wherein the instructions to calculate the combined impedance parameter comprises calculating a weighted average between the first set of impedance related data and the second set of impedance related data.

20. The plasma processing system of claim 17, wherein the program further comprises instructions to:

measure, by the output sensor of the RF match, a third set of impedance related data of the plasma processing system over a third time period, the third time period beginning after a third delay beginning at a same time as the first delay;

measure, by the output sensor of the RF match, a fourth set of impedance related data of the plasma processing system over a fourth time period, the fourth time period beginning after a fourth delay beginning at a same time as the first delay; and calculate, by the RF match, the combined impedance parameter based on the measured first set of impedance related data, the measured second set of impedance related data, the measured third set of impedance related data, and the measured fourth set of impedance related data.

* * * * *